United States Patent
Chung et al.

(10) Patent No.: US 11,515,505 B2
(45) Date of Patent: Nov. 29, 2022

(54) DISPLAY DEVICE HAVING A TRANSMISSION AREA

(71) Applicant: Samsung Display Co., Ltd., Yongin-si (KR)

(72) Inventors: Jin Koo Chung, Suwon-si (KR); Beohm Rock Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 267 days.

(21) Appl. No.: 15/930,194

(22) Filed: May 12, 2020

(65) Prior Publication Data
US 2021/0066648 A1 Mar. 4, 2021

(30) Foreign Application Priority Data
Sep. 3, 2019 (KR) .......................... 10-2019-0108539

(51) Int. Cl.
*H01L 51/52* (2006.01)
*H01L 27/32* (2006.01)

(52) U.S. Cl.
CPC ........ *H01L 51/5253* (2013.01); *H01L 27/322* (2013.01); *H01L 27/3211* (2013.01); *H01L 27/3234* (2013.01); *H01L 27/3246* (2013.01); *H01L 51/5284* (2013.01)

(58) Field of Classification Search
CPC combination set(s) only.
See application file for complete search history.

(56) References Cited

U.S. PATENT DOCUMENTS

| | | | |
|---|---|---|---|
| 10,062,865 B2 | 8/2018 | Lee et al. | |
| 2012/0038267 A1 | 2/2012 | Hanamura et al. | |
| 2017/0179441 A1* | 6/2017 | Lee | H01L 27/3262 |
| 2018/0013100 A1* | 1/2018 | Yim | H01L 27/3244 |
| 2018/0113358 A1* | 4/2018 | Lee | G02F 1/13471 |

(Continued)

FOREIGN PATENT DOCUMENTS

| | | |
|---|---|---|
| CN | 109192759 A | 1/2019 |
| EP | 3 528 301 A2 | 8/2019 |

(Continued)

OTHER PUBLICATIONS

Extended European Search Report for Application No. EP 20 18 7421 dated Apr. 12, 2021, 11 pages.

*Primary Examiner* — Nduka E Ojeh
(74) *Attorney, Agent, or Firm* — Lewis Roca Rothgerber Christie LLP

(57) ABSTRACT

According to one embodiment, a display device includes a display panel having a first area and a second area, the first area including a first pixel area and a first surrounding area surrounding the first pixel area, and the second area including a second pixel area, a transmission area, and a second surrounding area surrounding the second pixel area and the transmission area, an encapsulation structure on the display panel and including at least one inorganic layer and at least one organic layer, a color filter on the encapsulation structure and overlapping the first pixel area and the second pixel area, a black matrix on the encapsulation structure and overlapping the first surrounding area and the second surrounding area, and a functional module on a rear surface of the display panel and overlapping the second area.

23 Claims, 14 Drawing Sheets

(56) References Cited

U.S. PATENT DOCUMENTS

| | | | |
|---|---|---|---|
| 2018/0198067 A1 | 7/2018 | Kim et al. | |
| 2019/0067646 A1* | 2/2019 | Ichikawa | H01L 51/50 |
| 2019/0207156 A1 | 7/2019 | Gil | |
| 2020/0075680 A1* | 3/2020 | Sun | H01L 51/5256 |
| 2020/0136068 A1* | 4/2020 | Lee | H01L 51/56 |
| 2020/0381498 A1* | 12/2020 | Kim | H01L 27/322 |

FOREIGN PATENT DOCUMENTS

| | | |
|---|---|---|
| KR | 10-2017-0113066 A | 10/2017 |
| KR | 10-2018-0046708 A | 5/2018 |
| KR | 10-2018-0057796 A | 5/2018 |
| KR | 10-2018-0083459 A | 7/2018 |
| KR | 10-1957838 B1 | 3/2019 |

* cited by examiner

DISPLAY DEVICE HAVING A TRANSMISSION AREA

CROSS-REFERENCE TO RELATED APPLICATION

This application claims priority to and the benefit of Korean Patent Application No. 10-2019-0108539 filed on Sep. 3, 2019 in the Korean Intellectual Property Office (KIPO), the entire disclosure of which is incorporated by reference herein.

BACKGROUND

1. Field

Embodiments relate to a display device. More particularly, embodiments relate to a display device including a functional module.

2. Description of the Related Art

A display device may display images based on electrical signals, and may provide users visual information. The display device may include a transmission area, and external light incident onto the display device passes through the transmission area. A functional module such as a camera module, a sensor module, etc. disposed on a rear surface of the display device may sense or recognize objects, users, etc. that are located in front of the display device through the transmission area.

The display device may include wirings, electrodes, etc. including metal, so that external light incident onto the display device may be reflected by the wirings, electrodes, etc. To reduce or prevent the reflection of the external light, the display device may include a polarizing layer. Although the polarizing layer may reduce or prevent the reflection of the external light, however, the transmittance in the transmission area of the display device may be degraded due to the polarizing layer.

SUMMARY

Embodiments provide a display device having reduced external light reflectance and improved transmittance in a transmission area.

A display device according to embodiments may include a display panel having a first area and a second area, the first area including a first pixel area and a first surrounding area surrounding the first pixel area, and the second area including a second pixel area, a transmission area, and a second surrounding area surrounding the second pixel area and the transmission area, an encapsulation structure on the display panel and including at least one inorganic layer and at least one organic layer, a color filter on the encapsulation structure and overlapping the first pixel area and the second pixel area, a black matrix on the encapsulation structure and overlapping the first surrounding area and the second surrounding area, and a functional module on a rear surface of the display panel and overlapping the second area.

In an embodiment, the first pixel area may include a plurality of first sub-pixel areas, the second pixel area may include a plurality of second sub-pixel areas, and a number of the second sub-pixel areas per a unit area may be less than a number of the first sub-pixel areas per the unit area.

In an embodiment, the number of the second sub-pixel areas per the unit area may be ½, ¼, ⅑, or ¹⁄₁₆ of the number of the first sub-pixel areas per the unit area.

In an embodiment, an arrangement of the second sub-pixel areas may be different from an arrangement of the first sub-pixel areas.

In an embodiment, a size of each of the second sub-pixel areas may be greater than a size of each of the first sub-pixel areas.

In an embodiment, the first area may surround at least a portion of the second area.

In an embodiment, the display device may further include an overcoat layer on the encapsulation structure and overlapping at least the transmission area.

In an embodiment, the overcoat layer may cover the color filter and the black matrix, and may have a planarized upper surface.

In an embodiment, the display panel may include a substrate, a plurality of conductive layers at a plurality of different layers from each other on the substrate, an organic insulation layer on the conductive layers, a pixel electrode on the organic insulation layer, a pixel defining layer on the pixel electrode and defining the first pixel area and the second pixel area, an emission layer on the pixel electrode, and an opposite electrode on the emission layer and the pixel defining layer. At least one of the organic insulation layer, the pixel defining layer, and the opposite electrode may have an opening overlapping the transmission area.

In an embodiment, the pixel defining layer may have a black color.

In an embodiment, the display panel may further include a plurality of inorganic insulation layers at a plurality of different layers from each other on the substrate and insulating the conductive layers. At least one of the inorganic insulation layers may have an opening overlapping the transmission area.

In an embodiment, the pixel defining layer may overlap a portion of each of the conductive layers, the inorganic insulation layers, and the organic insulation layer that overlap the transmission area.

In an embodiment, the display device may further include a shielding layer overlapping at least the first surrounding area and the second surrounding area.

In an embodiment, the shielding layer may be on the black matrix.

In an embodiment, the shielding layer may be between the encapsulation structure and the black matrix.

In an embodiment, the shielding layer may overlap a portion of each of the conductive layers, the inorganic insulation layers, the organic insulation layer, the pixel defining layer, and the opposite electrode that overlap the transmission area.

In an embodiment, the encapsulation structure may include a first inorganic layer, an organic layer on the first inorganic layer, and a second inorganic layer on the organic layer.

In an embodiment, the encapsulation structure may further include a first low refractive inorganic layer between the first inorganic layer and the organic layer, the low refractive inorganic layer having a refractive index less than a refractive index of the first inorganic layer and greater than a refractive index of the organic layer, and a second low refractive inorganic layer between the organic layer and the first inorganic layer and having a refractive index greater than the refractive index of the organic layer and less than a refractive index of the second inorganic layer.

In an embodiment, each of the first low refractive inorganic layer and the second low refractive inorganic layer may include silicon oxynitride.

In an embodiment, the encapsulation structure may further include a low refractive inorganic layer on the second inorganic layer and having a refractive index less than a refractive index of the second inorganic layer.

In an embodiment, the low refractive inorganic layer may include silicon oxynitride.

In an embodiment, each of a difference between a refractive index of the first inorganic layer and a refractive index of the organic layer and a difference between the refractive index of the organic layer and a refractive index of the second inorganic layer may be less than about 0.2.

In an embodiment, each of the first inorganic layer and the second inorganic layer may include silicon oxynitride.

In an embodiment, the functional module may include at least one of a camera module, a face recognition sensor module, a pupil recognition sensor module, an acceleration sensor module, a proximity sensor module, an infrared sensor module, and an ambient light sensor module.

A display device according to embodiments may include a display panel having a first area and a second area, the first area including a first pixel area and a first surrounding area surrounding the first pixel area, and the second area including a second pixel area, a transmission area and a second surrounding area surrounding the second pixel area and the transmission area, an encapsulation structure on the display panel and including at least one inorganic layer and at least one organic layer, a color filter on the encapsulation structure and overlapping the first pixel area and the second pixel area, and a black matrix on the encapsulation structure and overlapping the first surrounding area and the second surrounding area. The display panel may include a transmitting window formed in at least one of a plurality of insulation layers included in the display panel and overlapping the transmission area.

The display device according to embodiments may include the color filter on the encapsulation structure and overlapping the first and second pixel areas of the display panel and the black matrix on the encapsulation structure and overlapping the first and second surrounding areas of the display panel, and the display panel may include the transmitting window overlapping the transmission area. Accordingly, a polarizing layer may be omitted, and thus, the transmittance of the transmission area may increase and the reflection of external light may be prevented.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
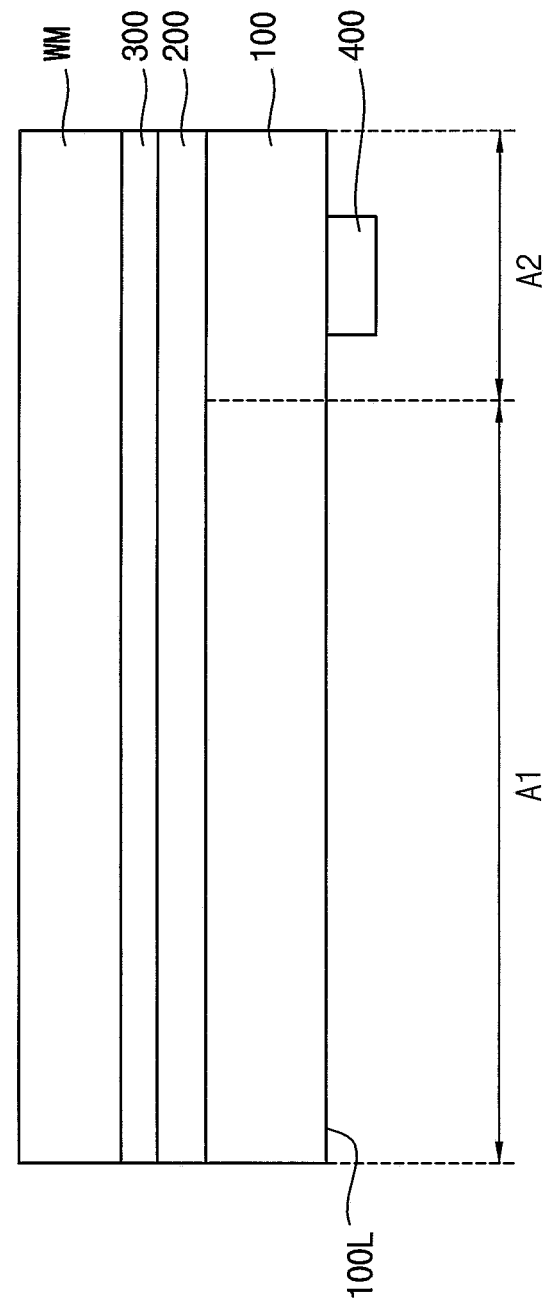
FIG. 1 is a cross-sectional view illustrating a display device according to an embodiment.

Hereinafter, display devices in accordance with embodiments will be explained in detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, when two elements or components that are both disposed on the same substrate "overlap," the two elements or components are, respectively, above and below one another and arranged such that a line perpendicular to the substrate passes through both elements.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a cross-sectional view illustrating a display device according to an embodiment.

Referring to FIG. 1, a display device may include a display panel 100, an encapsulation structure 200, a color filter layer 300, a window WM, and a functional module 400.

The display panel 100 may have a first area A1 and a second area A2. Each of the first area A1 and the second area A2 may be a display area for displaying an image. The second area A2 may include a transmission area transmitting external light. Accordingly, the second area A2 may transmit the external light incident onto the second area A2, and may also display the image. The first area A1 and the second area A2 may be located to be adjacent to each other.

The encapsulation structure 200 may be disposed on the display panel 100. The encapsulation structure 200 may block or prevent impurities such as oxygen, moisture, etc. from permeating into a light emitting element included in the display panel 100. Further, the encapsulation structure 200 may protect the light emitting element from external impact.

The color filter layer 300 may be disposed on the encapsulation structure 200. The color filter layer 300 may reduce or prevent the reflection of external light incident onto the display device. Further, the color filter layer 300 may transmit light generated from the display panel 100, and may improve a purity of the color of the image displayed by the display device.

The window WM may be disposed on the color filter layer 300. The window WM may protect elements of the display device, and may provide a display surface (or front surface) through which the image formed from the display panel 100 is displayed.

The functional module 400 may be disposed on a lower surface (or rear surface) 100L of the display panel 100. The functional module 400 may include, for example, a camera module for taking a photo of (or recognizing) an image of an object located in front of the display device, a face recognition sensor module for sensing a face of a user, a pupil recognition sensor module for sensing pupils of a user, an acceleration sensor module for determining a movement of the display device, a proximity sensor module and an infrared sensor module for detecting proximity of objects to a front surface of the display device, an ambient light sensor module for measuring external brightness, or the like.

The functional module 400 may overlap the second area A2 of the display panel 100. The second area A2 may include the transmission area as described above, so that the functional module 400 disposed on the lower surface (or rear surface) 100L of the display panel 100 (or behind the display panel 100) may sense or recognize an object or a user in front of the display device (or in front of the display panel, e.g., facing a front surface or upper surface of the display panel) through the transmission area included in the second area A2 of the display panel 100.

Figure 2:
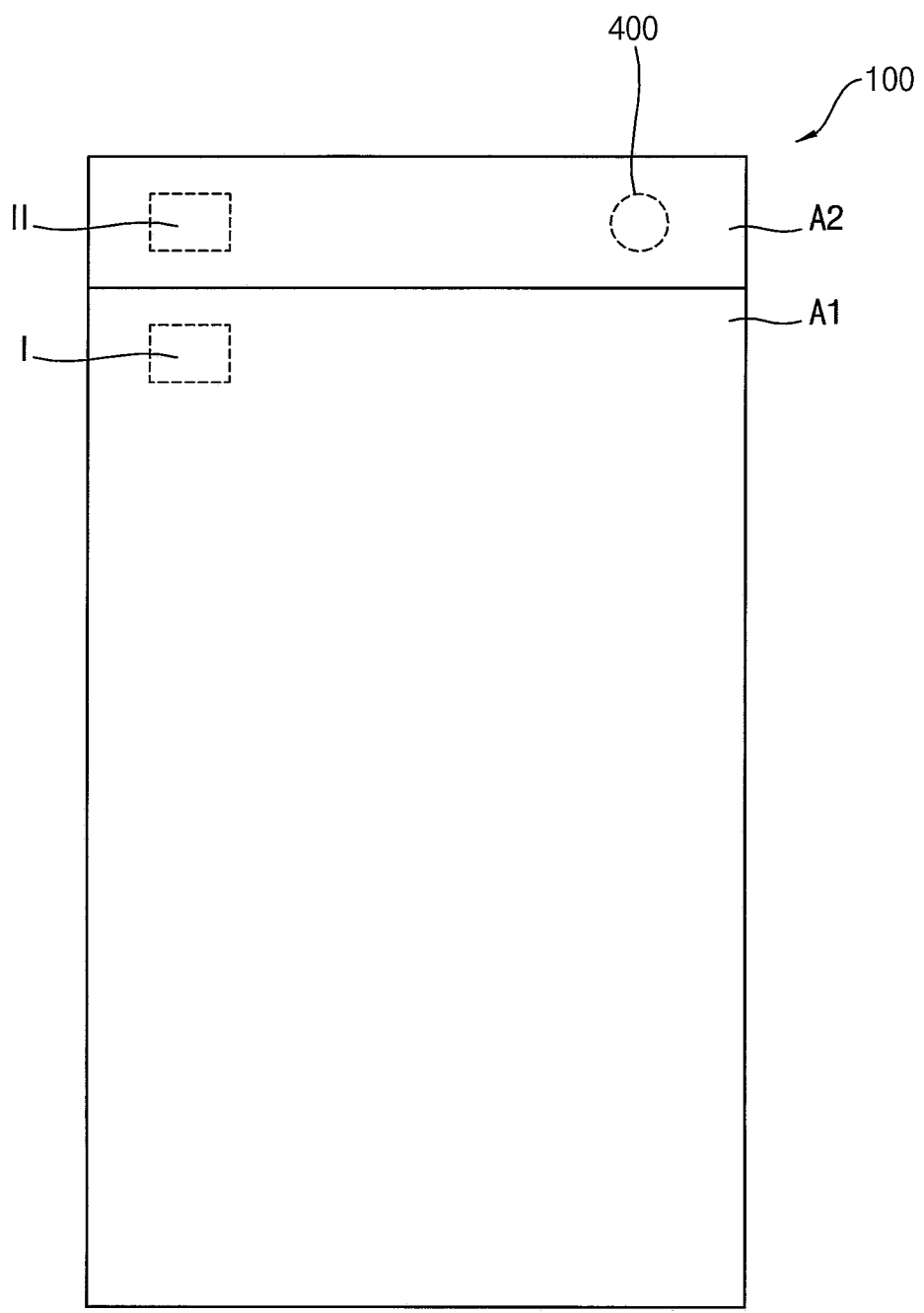
FIG. 2 is a plan view illustrating a display panel according to an embodiment.

FIG. 2 is a plan view illustrating the display panel 100 according to an embodiment. FIG. 2 may illustrate an example of the display panel 100 in FIG. 1.

Referring to FIG. 2, in an embodiment, the second area A2 may be located in any portion of the display panel 100 in a plan view so long as the second area A2 overlaps the functional module 400 (e.g., so long as the second area A2 overlaps the location of the functional module 400 along a direction perpendicular to the display surface). In other words, the functional module 400 may be disposed in any portion of the second area A2 in a plan view (e.g., so long as the functional module 400 overlaps with the second area A2 along a direction perpendicular to the display surface). Further, the second area A2 may have a shape (e.g., a predetermined shape) that is substantially independent of a shape of the functional module 400 in a plan view. FIG. 2 illustrates that the second area A2 is located at a side of the first area A1 in a plan view and has a rectangular planar shape. However, embodiments of the present disclosure are not limited thereto, and the second area A2 may be disposed to surround the first area A1 in a plan view, or may have a polygonal planar shape. Accordingly, the functional module 400 may be disposed in various locations on the lower surface (or rear surface) of the display panel 100 within an area overlapping the second area A2 in the plan view, regardless of a shape of the functional module 400.

Figure 3:
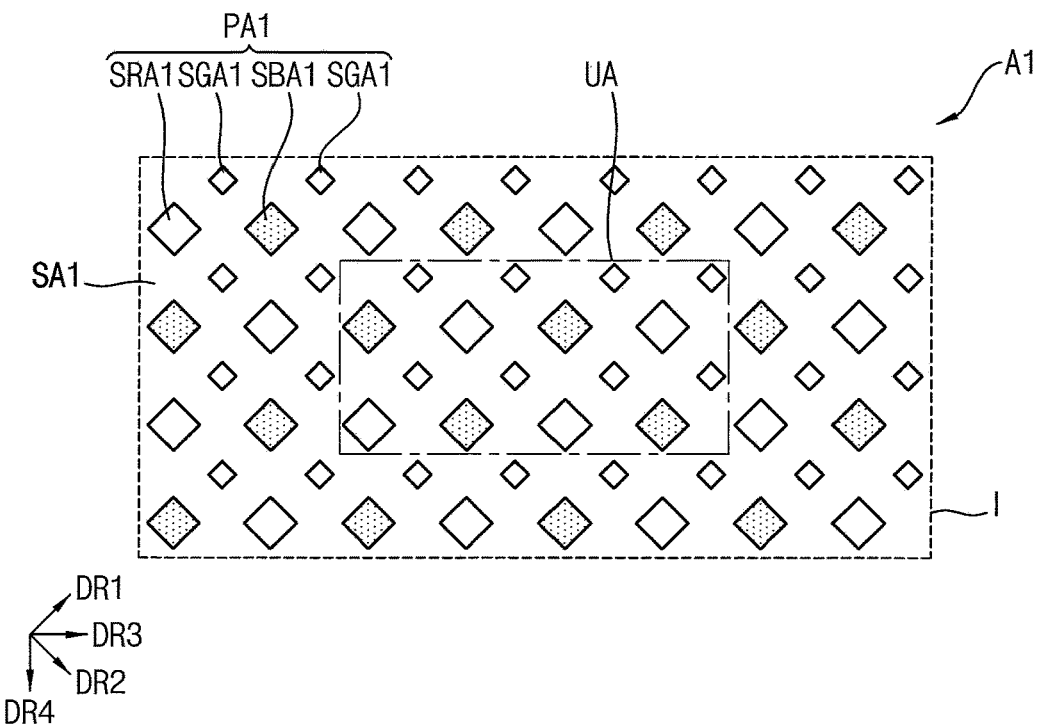
FIG. 3 is a plan view illustrating a first area according to an embodiment.
Figure 4:
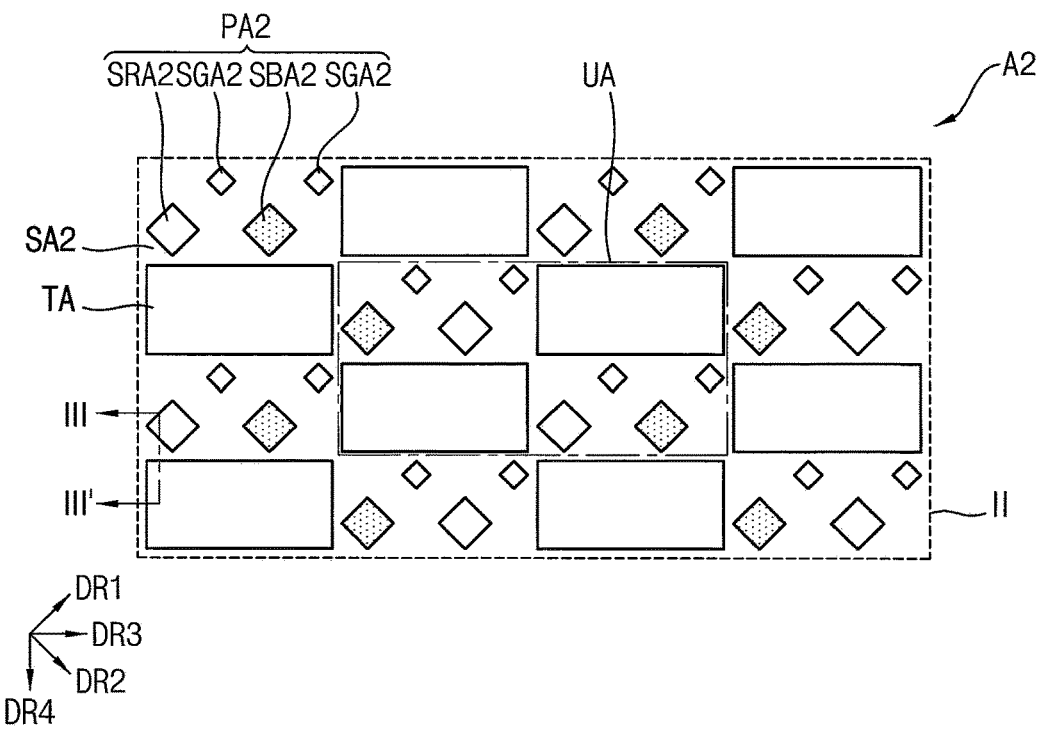
FIG. 4 is a plan view illustrating a second area according to an embodiment.

FIG. 3 is a plan view illustrating the first area A1 according to an embodiment. FIG. 4 is a plan view illustrating the second area A2 according to an embodiment. FIG. 3 may illustrate an example of an area I of FIG. 2, and FIG. 4 may illustrate an example of an area II of FIG. 2.

Referring to FIGS. 3 and 4, the first area A1 may include a first pixel area PA1 and a first surrounding area SA1, and the second area A2 may include a second pixel area PA2, a transmission area TA, and a second surrounding area SA2. Each of the first pixel area PA1 and the second pixel area PA2 may be an area in which the pixels are disposed and from which light generated from each of the pixels is emitted.

The first pixel area PA1 may include a plurality of first sub-pixel areas SRA1, SGA1, and SBA1 emitting light of different colors (e.g., different colored lights), and the second pixel area PA2 may include a plurality of second sub-pixel areas SRA2, SGA2, and SBA2 emitting light of different colors (e.g., different colored lights). In an embodiment, the first sub-pixel areas SRA1, SGA1, and SBA1 may include a first red pixel area SRA1 emitting red light, a first green pixel area SGA1 emitting green light and a first blue pixel area SBA1 emitting blue light, and the second sub-pixel areas SRA2, SGA2, and SBA2 may include a second red pixel area SRA2 emitting red light, a second green pixel area SGA2 emitting green light and a second blue pixel area SBA2 emitting blue light.

The transmission area TA may be an area that transmits external light that is incident onto the display panel 100 (e.g., incident onto the transmission area TA of the display panel 100). Because the second area A2 includes the transmission area TA transmitting the external light, the functional module 400 disposed on the lower surface (or rear surface) of the display panel 100 (or behind the display panel 100) and overlapping the second area A2 may sense or recognize an object or a user in front of the display device by detecting the external light that is passes through (or is transmitted through) the transmission area TA. The first surrounding area SA1 may surround the first pixel area PA1. The second surrounding area SA2 may surround the second pixel area PA2 and the transmission area TA. Each of the first surrounding area SA1 and the second surrounding area SA2 may be an area from which light is not emitted and through which the external light does not pass.

Because the second area A2 includes the transmission area TA, the number of the second sub-pixel areas SRA2, SGA2, and SBA2 per a unit area may be less than the number of the first sub-pixel areas SRA1, SGA1, and SBA1 per the unit area. In other words, a resolution of the second area A2 may be less than a resolution of the first area A1 (e.g., the second area A2 may have a lower resolution than the first area A1 or a density of second sub-pixel areas SRA2, SGA2, and SBA2 of the second area A2 may be lower than a density of first sub-pixel areas SRA1, SGA1, and SBA1 of the first area A1).

In an embodiment, the number of the second sub-pixel areas SRA2, SGA2, and SBA2 per the unit area may be ½ (or half or 50%) of the number of the first sub-pixel areas SRA1, SGA1, and SBA1 per the unit area. For example, as illustrated in FIGS. 3 and 4, FIG. 3 shows sixteen (16) first sub-pixel areas SRA1, SGA1, and SBA1 per unit area UA, and FIG. 4 shows eight (8) second sub-pixel areas SRA2, SGA2, and SBA2 per unit area UA (e.g., a unit area UA of the same size as the unit area UA shown in FIG. 3).

In the first area A1, the first green pixel area SGA1 may be spaced (or spaced apart) from the first red pixel area SRA1 in (or along) a first direction DR1 or a second direction DR2 perpendicular to the first direction DR1. Further, the first blue pixel area SBA1 may be spaced (or spaced apart) from the first red pixel area SRA1 in (or along) a third direction DR3 between the first direction DR1 and the second direction DR2 (e.g., bisecting the first direction DR1 and the second direction DR2) or a fourth direction DR4 perpendicular to the third direction DR3. For example, the third direction DR3 may form a 45 degree angle with the first direction DR1 in a clockwise direction, and the fourth direction DR4 may form a 45 degree angle with the second direction DR2 in the clockwise direction.

In an embodiment, an arrangement of the second sub-pixel areas SRA2, SGA2, and SBA2 may be substantially the same as an arrangement of the first sub-pixel areas SRA1, SGA1, and SBA1. In such an embodiment, in the second area A2, the second green pixel area SGA2 may be spaced (or spaced apart) from the second red pixel area SRA2 in (or along) the first direction DR1 or the second direction DR2. Further, the second blue pixel area SBA2 may be spaced (or spaced apart) from the second red pixel area SRA2 in the third direction DR3 or the fourth direction DR4.

In an embodiment, a size of each of the second sub-pixel areas SRA2, SGA2, and SBA2 may be substantially the same as a size as a respective one of each of the first sub-pixel areas SRA1, SGA1, and SBA1. For example, a size of the second red pixel area SRA2, a size of the second green pixel area SGA2, and a size of the second blue pixel area SBA2 may be substantially the same as a size of the first red pixel area SRA1, a size of the first green pixel area SGA1, and a size of the first blue pixel area SBA1, respectively.

Figure 5:
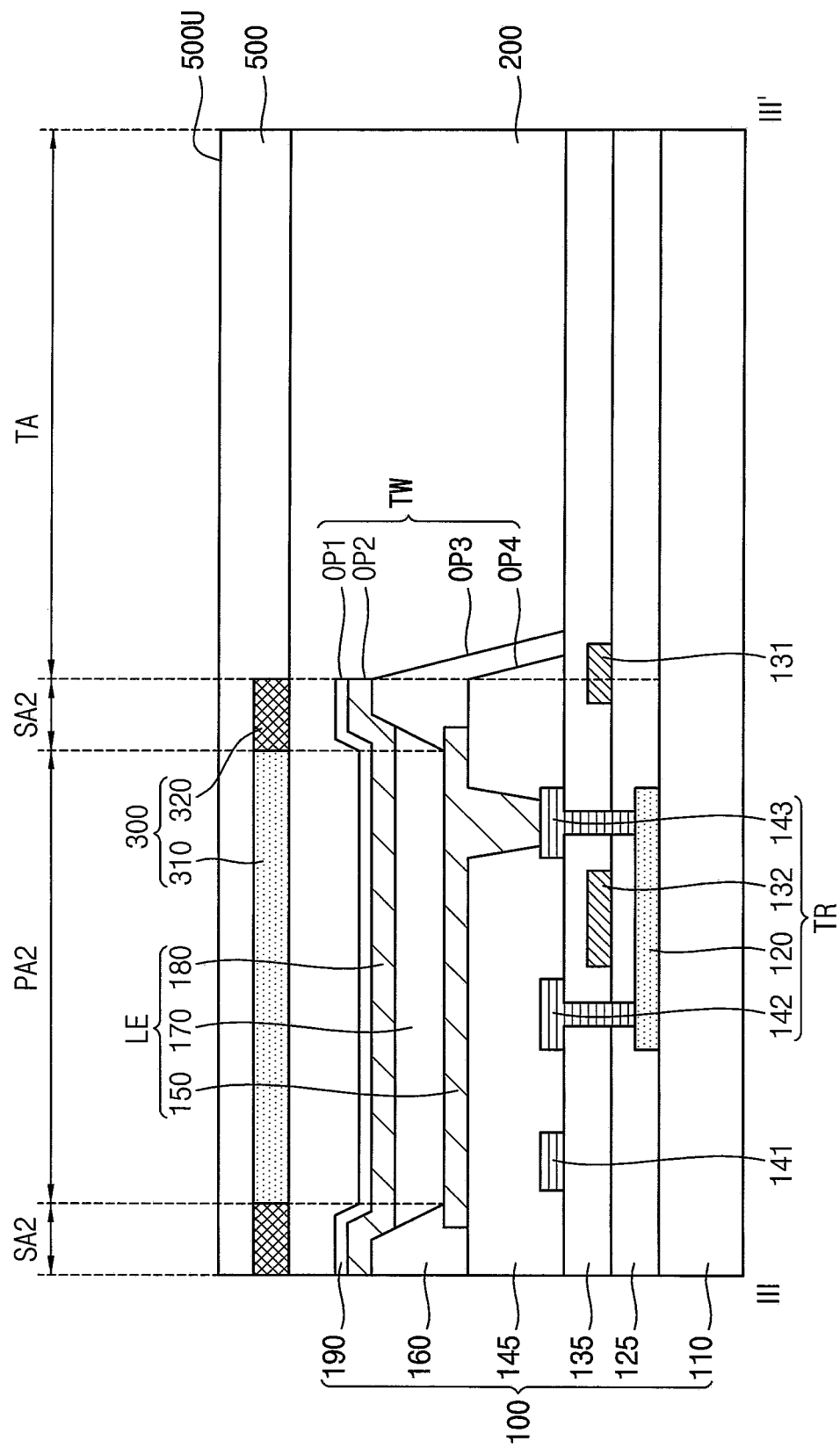
FIG. 5 is a cross-sectional view illustrating a portion of a display device according to an embodiment.

FIG. 5 is a cross-sectional view illustrating a portion of a display device according to an embodiment. FIG. 5 may illustrate an example of the second area A2 taken along a line III-III' in FIG. 4.

While FIG. 5 illustrates a cross-sectional structure of the second area A2, a cross-sectional structure of the first area A1 may be substantially the same as the cross-sectional structure of the second area A2 except for the transmission area TA. In other words, a cross-sectional structure of the first pixel area PA1 and a cross-sectional structure of the first surrounding area SA1 may be substantially the same as a cross-sectional structure of the second pixel area PA2 and a cross-sectional structure of the second surrounding area SA2, respectively.

Referring to FIG. 5, a display device may include a display panel 100, an encapsulation structure 200, a color filter layer 300, and an overcoat layer 500. The display panel 100 may include a substrate 110, a plurality of conductive layers 120, 131, 132, 141, 142, and 143 (the conductive layers may include one or more semiconductor layers), a plurality of inorganic insulation layers 125 and 135, an organic insulation layer 145, a pixel electrode 150, a pixel defining layer 160, an emission layer 170, and an opposite electrode 180.

The substrate 110 may be a transparent insulating substrate. For example, the substrate 110 may be formed of glass, quartz, plastic, or the like.

The conductive layers 120, 131, 132, 141, 142, and 143 located on different layers from each other may be disposed on the substrate 110. The conductive layers 120, 131, 132, 141, 142, and 143 may include an active layer 120, a gate line 131, a gate electrode 132, a data line 141, a source electrode 142, and a drain electrode 143. Further, the inorganic insulation layers 125 and 135 located on different layers from each other and insulating the conductive layers 120, 131, 132, 141, 142, and 143 may be disposed on the substrate 110. The inorganic insulation layers 125 and 135 may include a gate insulation layer 125 and an insulation interlayer 135.

The active layer 120 may be disposed on the substrate 110. The active layer 120 may be formed of amorphous silicon, polysilicon, an oxide semiconductor, or the like. The active layer 120 may include a source region, a drain region, and a channel region disposed between the source region and the drain region. The source region and the drain region may be doped with P-type or N-type impurities, and the channel region may be doped with a different type of impurities from the impurities doped in the source region and the drain region (e.g., if the source and drain regions are doped with P-type impurities, then the channel region may be doped with N-type impurities; likewise, if the source and drain regions are doped with N-type impurities, then the channel region may be doped with P-type impurities).

The gate insulation layer 125 may be disposed on the active layer 120. The gate insulation layer 125 may cover the active layer 120, and may be formed on the substrate 110. The gate insulation layer 125 may insulate the gate line 131 and the gate electrode 132 from the active layer 120. The gate insulation layer 125 may be formed of an inorganic insulation material such as silicon nitride, silicon oxide, silicon oxynitride, or the like.

The gate line 131 and the gate electrode 132 may be disposed on the gate insulation layer 125. The gate line 131 may extend in a direction (e.g., a row direction of the display panel), and may transmit a gate signal. The gate electrode 132 may overlap the channel region of the active layer 120. The gate line 131 and the gate electrode 132 may be formed of conductive material such as metal, an alloy of the metal, or the like.

The insulation interlayer 135 may be disposed on the gate line 131 and the gate electrode 132. The insulation interlayer 135 may cover the gate line 131 and the gate electrode 132, and may be formed on the gate insulation layer 125. The insulation interlayer 135 may insulate the data line 141, the source electrode 142, and the drain electrode 143 from the gate line 131 and the gate electrode 132. The insulation interlayer 135 may be formed of an inorganic insulation material such as silicon nitride, silicon oxide, silicon oxynitride, or the like.

The data line 141, the source electrode 142, and the drain electrode 143 may be disposed on the insulation interlayer 135. The data line 141 may extend in a direction crossing the gate line 131 (e.g., a column direction of the display panel), and may transmit a data signal. The source electrode 142 may be connected to the source region of the active layer 120, and the drain electrode 143 may be connected to the drain region of the active layer 120. The data line 141, the source electrode 142, and the drain electrode 143 may be formed of a conductive material such as metal, an alloy of the metal, or the like. The active layer 120, the gate electrode 132, the source electrode 142, and the drain electrode 143 may form a transistor TR.

The organic insulation layer 145 may be disposed on the data line 141, the source electrode 142, and the drain electrode 143. The organic insulation layer 145 may cover the data line 141, the source electrode 142, and the drain electrode 143, and may be formed on the insulation interlayer 135. The organic insulation layer 145 may protect the gate line 131, the data line 141, and the transistor TR, and may provide a planarized surface (or planar surface) thereon. The organic insulation layer 145 may be formed of inorganic insulation material such as polyimide (PI), or the like.

The pixel electrode 150 may be disposed on the organic insulation layer 145. The pixel electrode 150 may be connected to the source electrode 142 or the drain electrode 143. The pixel electrode 150 of each sub-pixel may be formed to correspond to the sizes and shapes of corresponding first sub-pixel areas SRA1, SGA1, and SBA1 of the first pixel area PA1 and of corresponding second sub-pixel areas SRA2, SGA2, and SBA2 of the second pixel area PA2. The pixel electrode 150 may be formed of conductive material such as metal, transparent conductive oxide, or the like.

The pixel defining layer 160 may be disposed on the pixel electrode 150. The pixel defining layer 160 may include a pixel opening exposing a center portion of the pixel electrode 150 thereby defining the first pixel area PA1 and the second pixel area PA2. Further, the pixel defining layer 160 may space the opposite electrode 180 from an edge of the pixel electrode 150 thereby reducing the likelihood or preventing arcing or the like from occurring between the edge of the pixel electrode 150 and the opposite electrode 180.

The emission layer 170 may be disposed on the pixel electrode 150. The emission layer 170 may be disposed on the portion of the pixel electrode 150 exposed by the pixel opening (e.g., the center portion of the pixel electrode 150). The emission layer 170 may include at least one of organic light emitting material and quantum dot.

In an embodiment, the organic light emitting material may include a low molecular weight polymer or a high molecular weight polymer. For example, the low molecular weight polymer may include copper phthalocyanine, N,N'-diphenylbenzidine, tris-(8-hydroxyquinoline)aluminum, etc., and the high molecular weight polymer may include poly(3,4-ethylenedioxythiophene), polyaniline, poly-phenylenevinylene, polyfluorene, etc.

In an embodiment, the quantum dot may include a core that includes a group II-VI compound, a group III-V compound, a group IV-VI compound, a group IV element, a group IV compound, and a combination thereof. In an embodiment, the quantum dot may have a core-shell structure that includes the core and a shell surrounding the core. The shell may serve as a protective layer for mitigating or preventing chemical degeneration of the core to maintain semiconductor properties of the core and a charging layer for imparting electrophoretic properties to the quantum dot.

The opposite electrode 180 may be disposed on the emission layer 170. The opposite electrode 180 may also be disposed on the pixel defining layer 160. The opposite electrode 180 may be opposite to (e.g., facing or extend in a plane parallel and overlapping) the pixel electrode 150 with the emission layer 170 in between (or therebetween). The opposite electrode 180 may be formed of a conductive material such as metal, transparent conductive oxide, or the like. The pixel electrode 160, the emission layer 170, and the opposite electrode 180 may form the light emitting element LE.

In an embodiment, the display panel 100 may further include a functional layer 190 disposed on the opposite electrode 180. The functional layer 190 may increase efficiency of light emitted from the light emitting element LE, and may protect the light emitting element LE. A structure of the functional layer 190 will be described in more detail with reference to FIG. 6 below.

The display panel 100 may include a transmitting window TW overlapping the transmission area TA. The transmitting window TW may be defined by openings of the elements of the display panel 100, where the openings overlap the transmission area TA. In an embodiment, the transmitting window TW may be formed in at least one of the insulation layers, e.g., the gate insulation layer 125, the insulation interlayer 135, the organic insulation layer 145, the pixel defining layer 160, or the like, included in the display panel 100.

At least one of the organic insulation layer 145, the pixel defining layer 160, and the opposite electrode 180 may have an opening overlapping the transmission area TA. Further, when the functional layer 190 is disposed on the opposite electrode 180, the functional layer 190 may have an opening overlapping the transmission area TA.

In an embodiment, the functional layer 190, the opposite electrode 180, the pixel defining layer 160, and the organic insulation layer 145 may have a first opening OP1, a second opening OP2, a third opening OP3, and a fourth opening OP4, respectively. In such an embodiment, the first opening OP1 of the functional layer 190, the second opening OP2 of the opposite electrode 180, the third opening OP3 of the pixel defining layer 160, and the fourth opening OP4 of the organic insulation layer 145 may form the transmitting window TW.

When insulation layers are stacked in the transmission area TA, reflectance of external light reflected at interfaces between adjacent insulation layers may increase. Further, when a conductive layer is disposed in the transmission area TA, external light reflected by the conductive layer may increase the reflectance of the transmission area TA. However, the display panel 100 according to one embodiment may include the transmitting window TW overlapping the transmission area TA, so that the number of interfaces between adjacent insulation layers in the transmission area TA may be reduced, or the size of the conductive layer disposed in the transmission area TA may be reduced versus comparative display panels. Accordingly, reflectance of external light at the interfaces between the adjacent insulation layers or by the conductive layer may decrease or be reduced in comparison to comparative display panels.

The encapsulation structure 200 may be disposed on the display panel 100. The encapsulation structure 200 may include at least one inorganic layer and at least one organic layer.

A portion of the encapsulation structure 200, which overlaps the first pixel area PA1, the first surrounding area SA1, the second pixel area PA2 and the second surrounding area SA2, may be disposed on the light emitting element LE, thereby preventing or blocking impurities from permeating into the light emitting element LE from outside and protecting the light emitting element LE from external impact. Further, a portion of the encapsulation structure 200, which overlaps the transmission area TA, may fill the transmitting window TW. The encapsulation structure 200 may have a planarized upper surface (or planar upper surface) throughout the first pixel area PA1, the first surrounding area SA1, the second pixel area PA2, the transmission area TA, and the second surrounding area SA2. Elements of the encapsulation structure 200 will be described in more detail with reference to FIG. 6 below.

The color filter layer 300 may be disposed on the encapsulation structure 200. The color filter layer 300 may include a color filter 310 and a black matrix 320.

The color filter 310 may overlap the first pixel area PA1 and the second pixel area PA2. The color filter 310 may include a red color filter, a green color filter, and a blue color filter. The red color filter may overlap the first red pixel area SRA1 and the second red pixel area SRA2, the green color filter may overlap the first green pixel area SGA1 and the second green pixel area SGA2, and the blue color filter may overlap the first blue pixel area SBA1 and the second blue pixel area SBA2.

The color filter 310 may absorb light of wavelengths except for (or other than) a wavelength (or wavelengths or a portion of a visible light spectrum) corresponding to respective color of the color filter 310 from external light. Accordingly, when light emitted from the light emitting element LE passes through the color filter 310 and is emitted to the outside, because the light does not mix with external light of another wavelength (e.g., of another color), the color filter 310 may reduce or prevent reflection of the external light and thereby increase or improve color purity of the light emitted from the light emitting element LE. The color filter 310 may be formed of acrylic resin, polyimide-based resin, or the like.

The black matrix 320 may overlap the first surrounding area SA1 and the second surrounding area SA2. The black matrix 320 may have a black color. The black matrix 320 may absorb most of external light incident onto the black matrix 320. Accordingly, the black matrix 320 may reduce or prevent the reflection of external light. The black matrix 320 may be formed of chromium (Cr), chromium oxide ($CrO_x$), chromium nitride ($CrN_x$), carbon black, a pigment mixture, a dye mixture, or the like.

The overcoat layer 500 may be disposed on the encapsulation structure 200. The overcoat layer 500 may overlap at least the transmission area TA thereby removing or planarizing a step formed by the color filter layer 300 on the encapsulation structure 200. The overcoat layer 500 may be formed of acrylic resin, polyimide-based resin, or the like.

In an embodiment, the overcoat layer 500 may cover the color filter 310 and the black matrix 320, and may have a planarized upper surface 500U. In such an embodiment, the overcoat layer 500 may overlap the first pixel area PA1, the first surrounding area SA1, the second pixel area PA2, the transmission area TA, and the second surrounding area SA2. The overcoat layer 500 may protect the color filter 310 and the black matrix 320 thereby improving reliability of the color filter 310 and the black matrix 320.

A comparative display device may include a polarizing layer disposed on the display panel 100 to reduce or prevent the reflection of external light. When the polarizing layer overlaps the transmission area TA, the transmittance of the transmission area TA may decrease, therefore, the transmittance of the second area A2 overlapping the functional module may decrease. However, the display device according to one embodiment may include the color filter 310 overlapping the first pixel area PA1 and the second pixel area PA2 and the black matrix 320 overlapping the first surrounding area SA1 and the second surrounding area SA2 to reduce or prevent the reflection of external light. In some embodiments, the color filter 310 and the black matrix 320 do not overlap the transmission area TA so that the transmittance of the transmission area TA may increase, therefore, the transmittance of the second area A2 overlapping the functional module may increase in comparison to the comparative display device.

Figure 6:
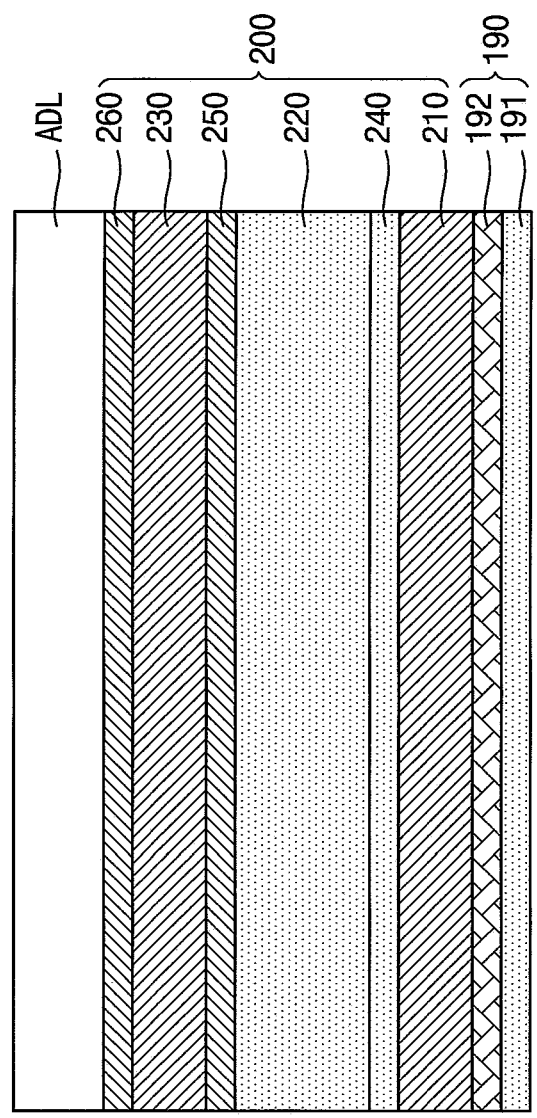
FIG. 6 is a cross-sectional view illustrating an encapsulation structure according to an embodiment.

FIG. 6 is a cross-sectional view illustrating the encapsulation structure 200 according to an embodiment. FIG. 6 may illustrate an example of the encapsulation structure 200 in FIG. 5.

Referring to FIGS. 5 and 6, the encapsulation structure 200 may be disposed on the functional layer 190. The functional layer 190 may include a capping layer 191 and a cover layer 192 disposed on the capping layer 191. The capping layer 191 may increase efficiency of light emitted from the light emitting element LE through refractive index matching. The cover layer 192 may protect or prevent the light emitting element LE from being damaged in the following process using plasma or the like. The capping layer 191 may include organic material, and the cover layer 192 may include lithium fluoride (LiF).

The encapsulation structure 200 may include a first inorganic layer 210, an organic layer 220, and an second inorganic layer 230. The organic layer 220 may be disposed on the first inorganic layer 210, and the second inorganic layer 230 may be disposed on the organic layer 220.

The first inorganic layer 210 and the second inorganic layer 230 may prevent or decrease impurities such as oxygen, moisture, or the like from permeating into the light emitting element LE. The organic layer 220 may improve encapsulating characteristics of the encapsulation structure 200, may alleviate inner stress of the first inorganic layer 210 and the second inorganic layer 230, may mitigate the effect of defects of the first inorganic layer 210 and the second inorganic layer 230, and may provide a planarized upper surface to the second inorganic layer 230.

In an embodiment, a difference between a refractive index of the first inorganic layer 210 and a refractive index of the organic layer 220 and a difference between the refractive index of the organic layer 220 and a refractive index of the second inorganic layer 230 may be about 0.2 or more. For example, the first inorganic layer 210 may include silicon nitride ($SiN_x$) or silicon oxynitride ($SiO_xN_y$) and have the refractive index of about 1.78, the organic layer 220 may include organic material such as epoxy-based resin, acrylic resin, polyimide-based resin, or the like and have the refractive index of about 1.53, and the second inorganic layer 230 may include silicon nitride ($SiN_x$) and have the refractive index of about 1.94. When a difference between refractive indexes of adjacent layers included in the encapsulation structure 200 is relatively large, reflectance of external light reflected at an interface between the adjacent layers may increase (e.g., compared to a case where a difference between the refractive indexes of adjacent layers is relatively small).

In an embodiment, the encapsulation structure 200 may further include a first low refractive inorganic layer 240 disposed between the first inorganic layer 210 and the organic layer 220 and a second low refractive inorganic layer 250 disposed between the organic layer 220 and the second inorganic layer 230.

A refractive index of the first low refractive inorganic layer 240 may be less than the refractive index of the first inorganic layer 210 and greater than the refractive index of the organic layer 220 (e.g., the first low refractive inorganic layer 240 may have an intermediate index of refraction between the refractive index of the first inorganic layer 210 and the organic layer 220). For example, the refractive index of the first low refractive inorganic layer 240 may be about 1.66. The refractive index of the second low refractive inorganic layer 250 may be greater than the refractive index of the organic layer 220 and less than the refractive index of the second inorganic layer 230 (e.g., the second low refractive inorganic layer 250 may have an intermediate index of refraction between the refractive index of the second inorganic layer 230 and the organic layer 220). For example, the refractive index of the second low refractive inorganic layer 250 may be about 1.71.

Each of the first low refractive inorganic layer 240 and the second low refractive inorganic layer 250 may include silicon oxynitride ($SiO_xN_y$). A ratio of oxygen and nitrogen of silicon oxynitride ($SiO_xN_y$) included in each of the first low refractive inorganic layer 240 and the second low refractive inorganic layer 250 may be changed to control a refractive index of each of the first low refractive inorganic layer 240 and the second low refractive inorganic layer 250. For example, a refractive index may increase when a ratio of nitrogen in silicon oxynitride ($SiO_xN_y$) is relatively large, and a refractive index may decrease when a ratio of oxygen in silicon oxynitride ($SiO_xN_y$) is relatively large.

The first low refractive inorganic layer 240 may be disposed between the first inorganic layer 210 and the organic layer 220 and the second low refractive inorganic layer 250 may be disposed between the organic layer 220 and the second inorganic layer 230, so that a difference between refractive indexes of adjacent layers included in the encapsulation structure 200 may be less than about 0.2. Accordingly, reflectance of external light reflected at an interface between the adjacent layers may decrease compared to an encapsulation structure that did not include the first low refractive inorganic layer 240 and the second low refractive inorganic layer 250. Therefore, transmittance of a portion of the encapsulation structure 200, which overlaps the transmission area TA, may increase, and transmittance of the second area A2 that the functional module overlaps may increase.

In an embodiment, the encapsulation structure 200 may further include a third low refractive inorganic layer 260 disposed on the second inorganic layer 230. A refractive index of the third low refractive inorganic layer 260 may be less than the refractive index of the second inorganic layer 230. For example, the refractive index of the third low refractive inorganic layer 260 may be about 1.71. The third low refractive inorganic layer 260 may include silicon oxynitride ($SiO_xN_y$).

An adhesive layer ADL for attaching elements of the display device disposed on the encapsulation structure 200 to an upper surface of the encapsulation structure 200 may be disposed on the encapsulation structure 200. The adhesive layer ADL may be a pressure sensitive adhesive (PSA), an optically clear adhesive (OCA), or the like, and a refractive index of the adhesive layer ADL may be, for example, about 1.53.

When the adhesive layer ADL, which has a refractive index largely (e.g., significantly) different from that of the second inorganic layer 230, is directly disposed on the second inorganic layer 230, the reflection of external light reflected at an interface between the second inorganic layer 230 and the adhesive layer ADL may increase. However, in one embodiment, the third low refractive inorganic layer 260 may be disposed between the second inorganic layer 230 and the adhesive layer ADL, so that reflection of external light reflected at each of an interface between the second inorganic layer 230 and the third low refractive inorganic layer 260 and an interface between the third low refractive inorganic layer 260 and the adhesive layer ADL may decrease.

Figure 7:
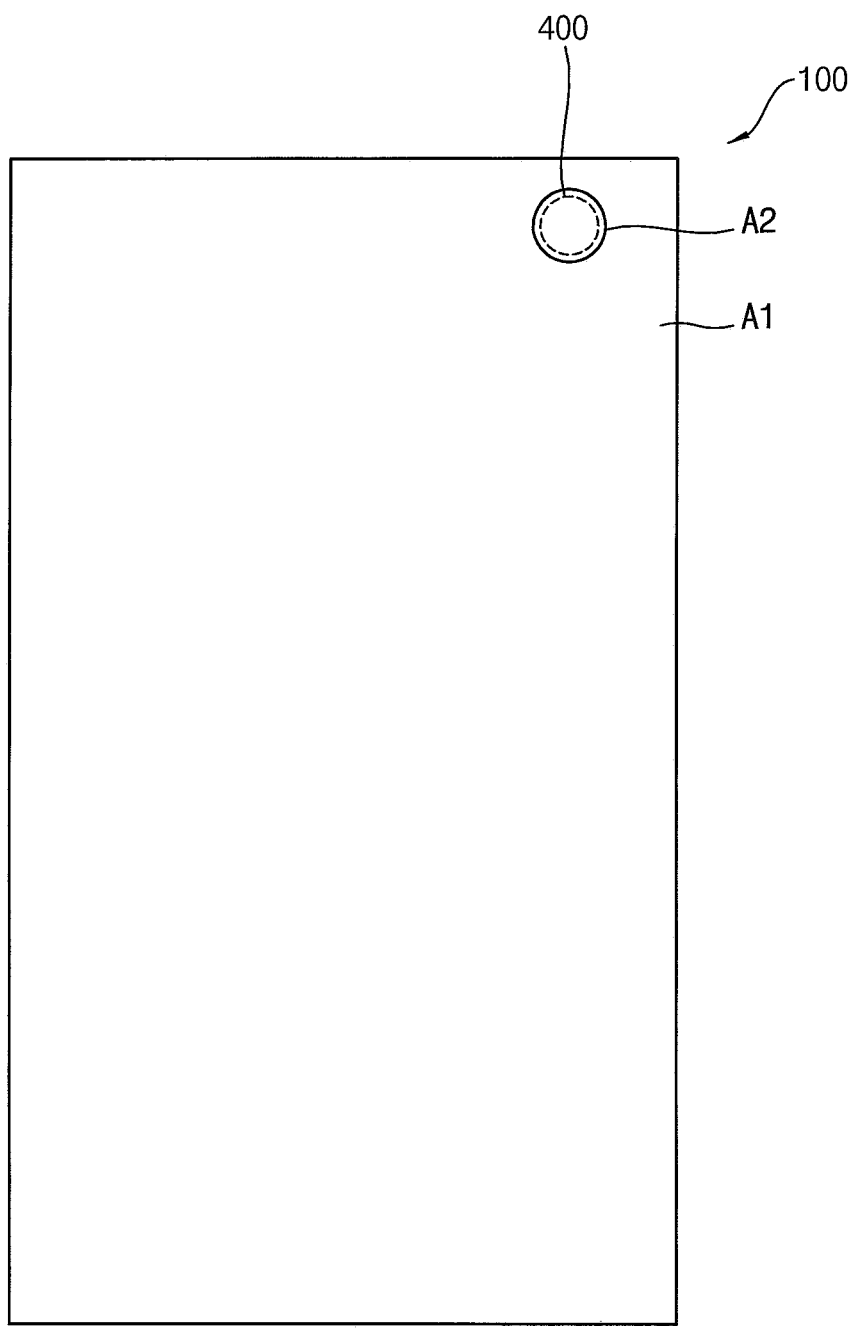
FIG. 7 is a plan view illustrating a display panel according to an embodiment.

FIG. 7 is a plan view illustrating a display panel according to an embodiment. FIG. 7 may illustrate another example of the display panel 100 in FIG. 1.

Referring to FIG. 7, in an embodiment, the second area A2 may be located to correspond to the location of the functional module 400 in a plan view. In other words, the functional module 400 may be disposed to correspond to the second area A2 in a plan view. Further, the second area A2 may have a shape substantially the same as a shape of the functional module 400 in a plan view. When the functional module 400 has a circular planar shape and is disposed in the display panel 100 while being spaced apart from an edge of the display panel in a plan view as illustrated in FIG. 7, the second area A2 may be located to correspond to the location of the functional module 400 and have a circular planar shape. In this case, the first area A1 may surround at least a portion of the second area A2 (in the embodiment shown in FIG. 7, the first area A1 surrounds the entirety of the second area A2 or completely surrounds the second area A2). Accordingly, a size of the second area A2 having a relatively low resolution (e.g., compared to the first area A1) may decrease (e.g., be kept small), and a size of the first area A1 having a relatively high resolution may increase.

Figure 8:
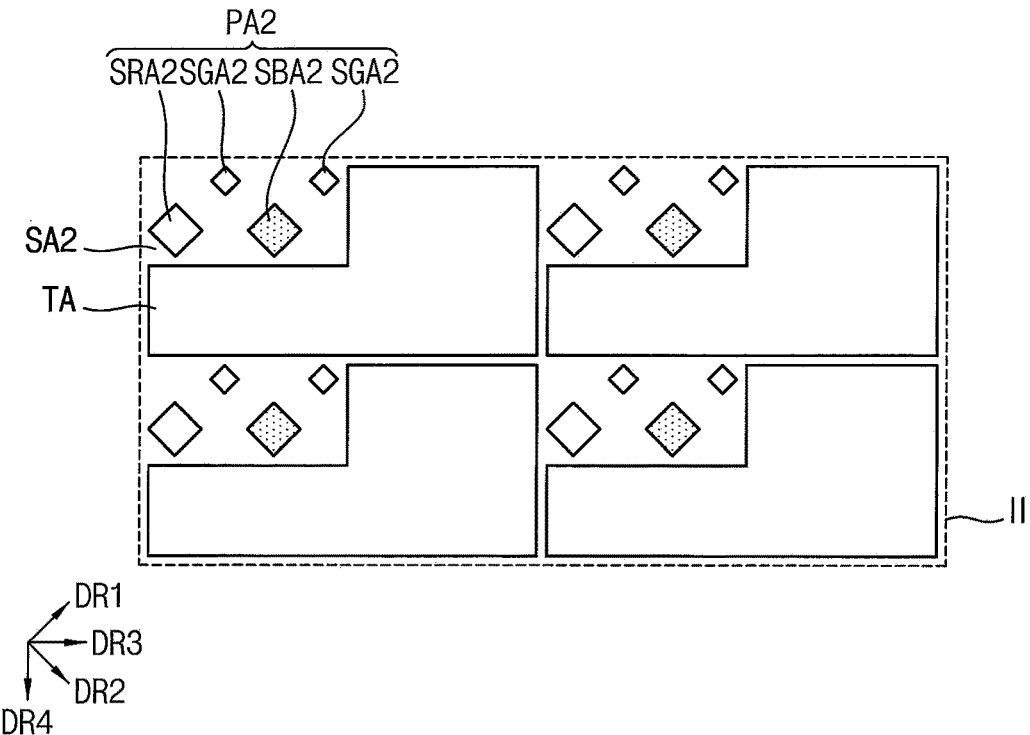
FIGS. 8, 9, and 10 are plan views illustrating a second area according to embodiments.
Figure 9:
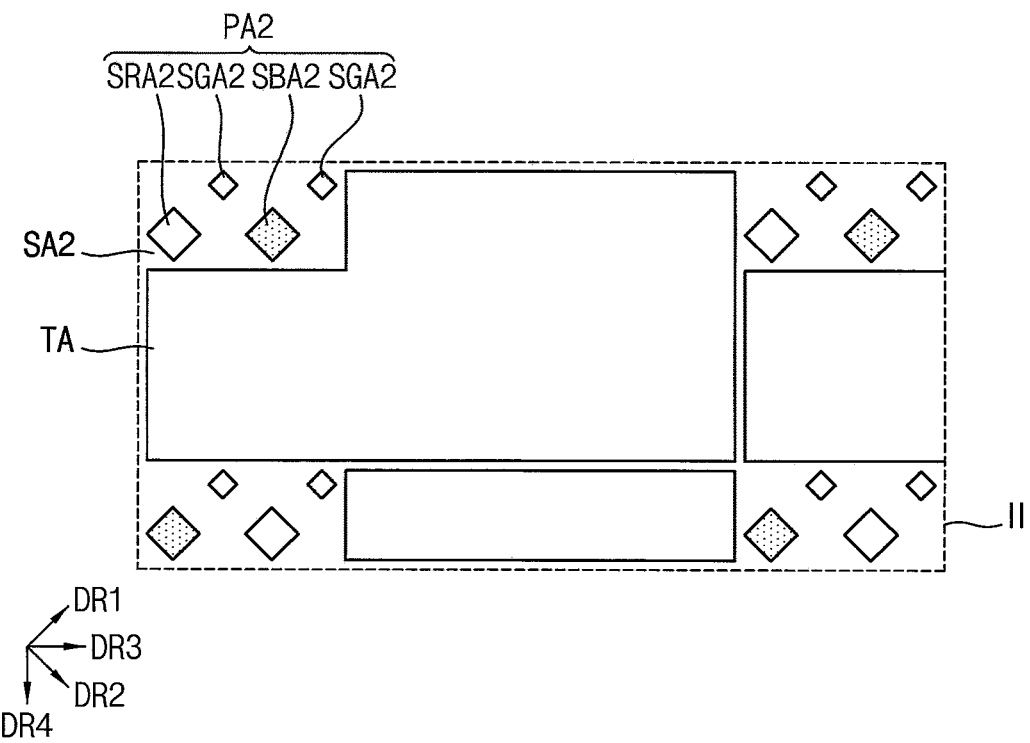
Figure 10:
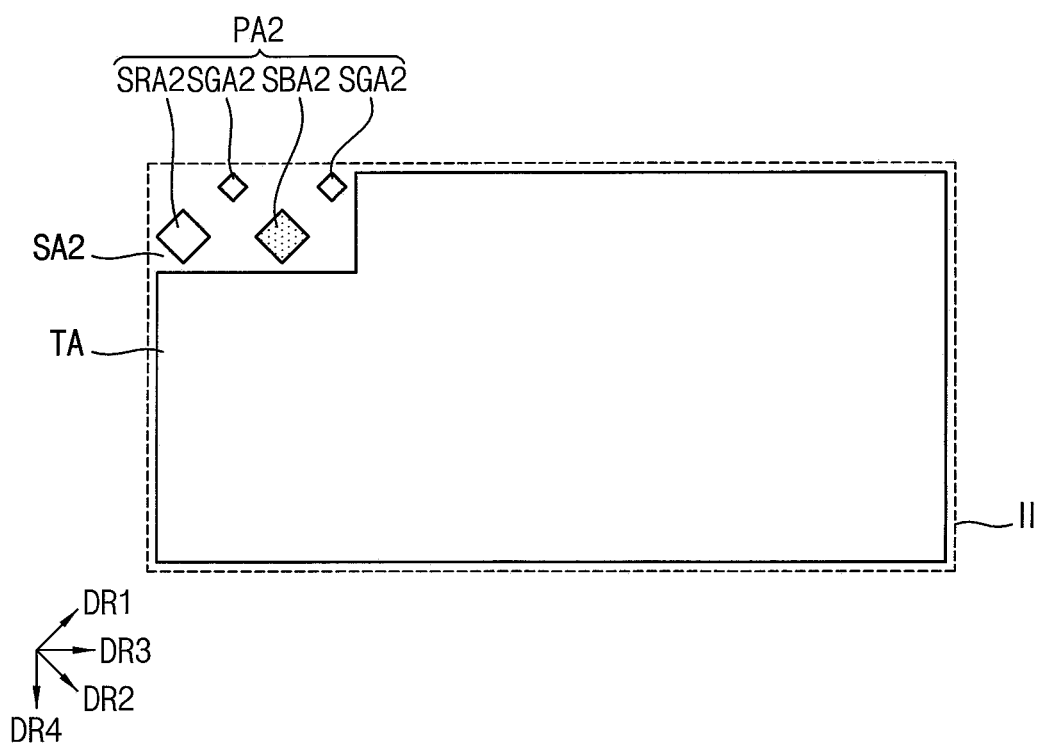

FIGS. 8, 9, and 10 are plan views illustrating a second area according to some embodiments. FIGS. 8, 9, and 10 may illustrate other examples of the area II in FIG. 2.

Descriptions on elements of the second area A2 described with reference to FIGS. 8, 9, and 10, which are substantially the same as or similar to those of the second area A2 described with reference to FIG. 4, will not be repeated in detail herein.

Referring to FIGS. 3, 8, 9, and 10, in some embodiments, the number of the second sub-pixel areas SRA2, SGA2, and SBA2 per the unit area may be ¼ (one fourth), ⅑ (one ninth), or ¹⁄₁₆ (one sixteenth) of the number of the first sub-pixel areas SRA1, SGA1, and SBA1 per the unit area. In one embodiment, as illustrated in FIGS. 3 and 8, when the number of the first sub-pixel areas SRA1, SGA1, and SBA1 per unit area is 16 (as shown in FIG. 3), the number of the second sub-pixel areas SRA2, SGA2, and SBA2 per the unit area may be 4 (as shown in FIG. 8).

In an embodiment, as illustrated in FIGS. 3 and 9, when the number of the first sub-pixel areas SRA1, SGA1, and SBA1 per unit area is 36 (as shown in FIG. 3), the number of the second sub-pixel areas SRA2, SGA2, and SBA2 per the unit area may be 4 (as shown in FIG. 9). In an embodiment, as illustrated in FIGS. 3 and 10, when the number of the first sub-pixel areas SRA1, SGA1, and SBA1 per unit area is 64 (as shown in FIG. 3), the number of the second sub-pixel areas SRA2, SGA2, and SBA2 per the unit area may be 4 (as shown in FIG. 10).

As a ratio of the number of the second sub-pixel areas SRA2, SGA2, and SBA2 per the unit area to the number of the first sub-pixel areas SRA1, SGA1, and SBA1 per the unit area decreases, the size of the transmission area TA may increase. Accordingly, as the size of the transmission area TA increases, the transmittance of the second area A2 may increase. As the ratio of the number of the second sub-pixel areas SRA2, SGA2, and SBA2 per the unit area to the number of the first sub-pixel areas SRA1, SGA1, and SBA1 per the unit area increases, the size of the second pixel area PA2 may increase. Accordingly, as the size of the second pixel area PA2 increases, the resolution of the second area A2 may increase.

Figure 11:
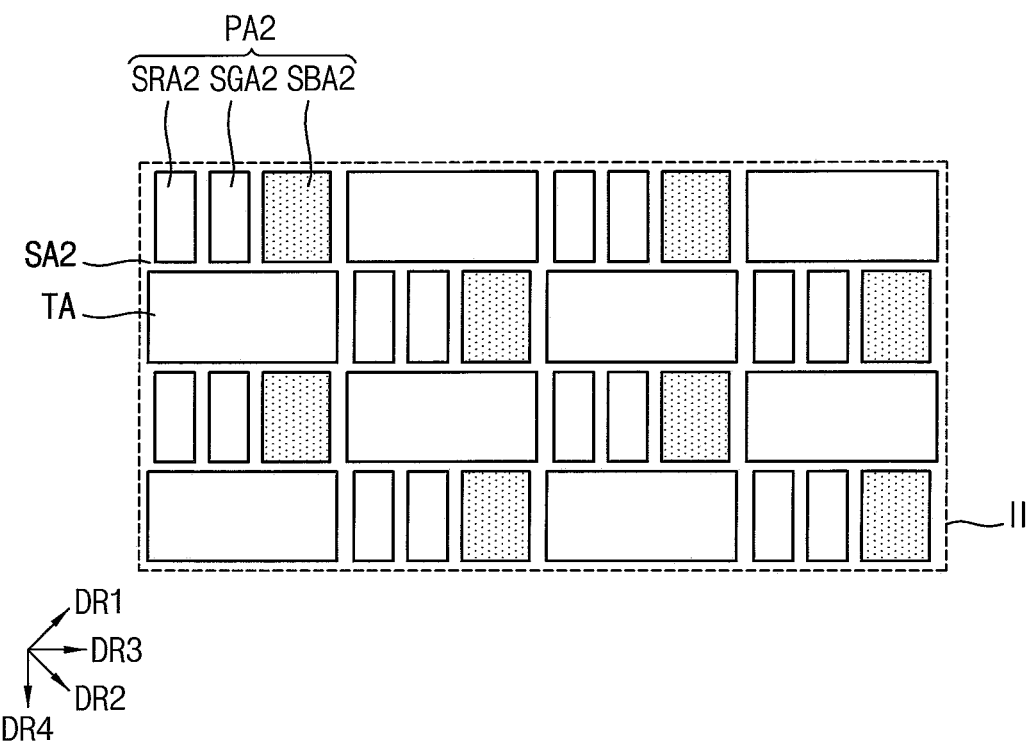
FIGS. 11 and 12 are plan views illustrating a second area according to embodiments.
Figure 12:
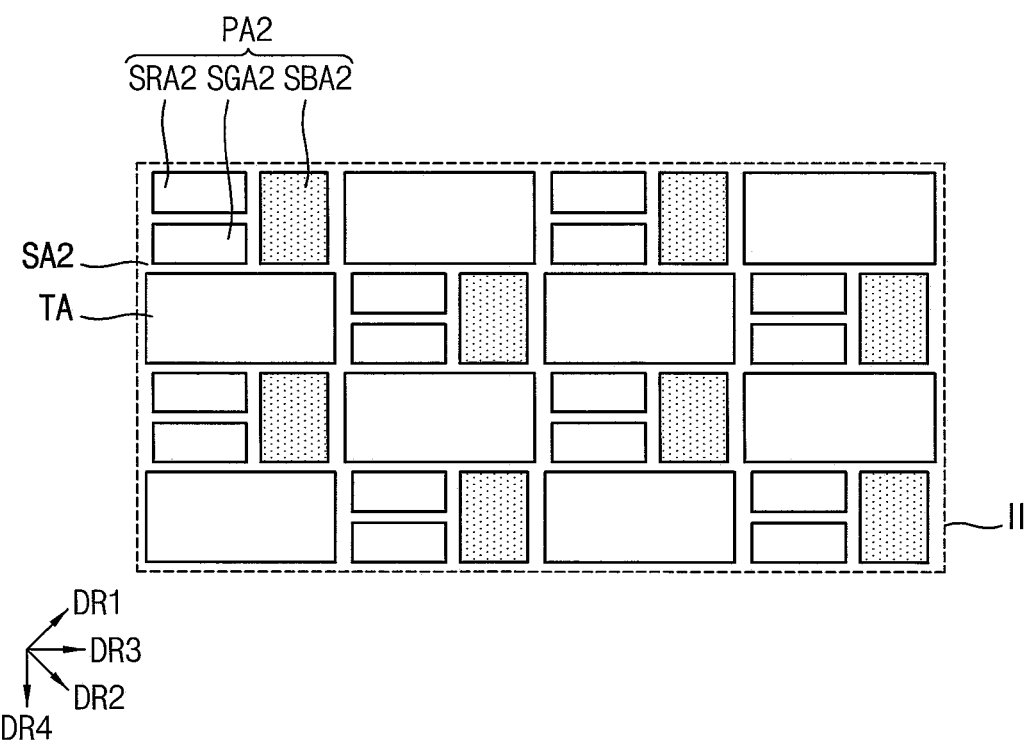

FIGS. 11 and 12 are plan views illustrating a second area according to embodiments. FIGS. 11 and 12 may illustrate other examples of the area II in FIG. 2.

Descriptions on elements of the second area A2 described with reference to FIGS. 11 and 12, which are substantially the same as or similar to those of the second area A2 described with reference to FIG. 4, will not be repeated.

Referring to FIGS. 3, 11, and 12, in embodiments, an arrangement of the second sub-pixel areas SRA2, SGA2, and SBA2 may be different from an arrangement of the first sub-pixel areas SRA1, SGA1, and SBA1. In an embodiment, in the second area A2, the second green pixel area SGA2 may be spaced from the second red pixel area SRA2 in or along the third direction DR3 as illustrated in FIG. 11. Further, the second blue pixel area SBA2 may be spaced from the second green pixel area SGA2 in the third direction DR3. In an embodiment, in the second area A2, the second green pixel area SGA2 may be spaced from the second red pixel area SRA2 in the fourth direction DR4 as illustrated in FIG. 12. Further, the second blue pixel area SBA2 may be spaced from the second red pixel area SRA2 and the second green pixel area SGA2 in the third direction DR3.

In an embodiment, a size of each of the second sub-pixel areas SRA2, SGA2, and SBA2 may be greater than a size of each of the first sub-pixel areas SRA1, SGA1, and SBA1. For example, a size of the second red pixel area SRA2, a size of the second green pixel area SGA2, and a size of the second blue pixel area SBA2 may be greater a size of the first red pixel area SRA1, a size of the first green pixel area SGA1, and a size of the first blue pixel area SBA1, respectively.

When the size of each of the second sub-pixel areas SRA2, SGA2, and SBA2 is substantially the same as the size of each of the first sub-pixel areas SRA1, SGA1, and SBA1, because the number of the second sub-pixel areas SRA2, SGA2, and SBA2 per the unit area is less than the number of the first sub-pixel areas SRA1, SGA1, and SBA1 per the unit area, a brightness of light emitted from the light emitting element disposed in the second pixel area PA2 may be greater than a brightness of light emitted from the light emitting element disposed in the first pixel area PA1 such that a brightness of an image displayed in the second area A2 may be substantially equal to a brightness of an image displayed in the first area A1. In this case, a lifespan of the light emitting element disposed in the second pixel area PA2 may decrease.

However, in one embodiment, because the size of each of the second sub-pixel areas SRA2, SGA2, and SBA2 is greater than the size of each of the first sub-pixel areas SRA1, SGA1, and SBA1, although the brightness of light emitted from the light emitting element disposed in the second pixel area PA2 is substantially equal to the brightness of light emitted from the light emitting element disposed in the first pixel area PA1, the brightness of an image displayed in the second area A2 may be substantially equal to the brightness of an image displayed in the first area A1. Accordingly, a lifespan of the light emitting element disposed in the second pixel area PA2 may increase or be improved.

Figure 13:
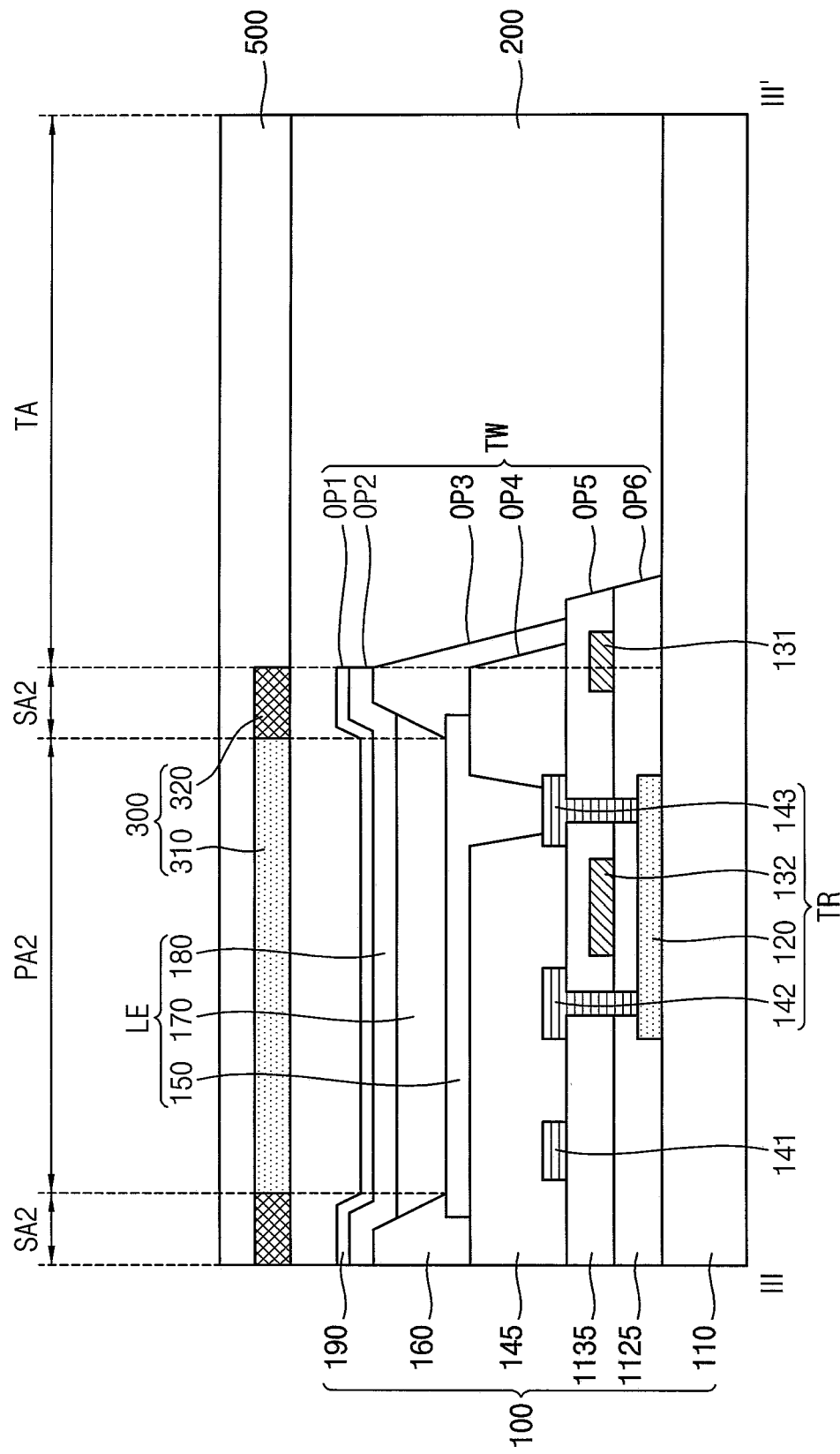
FIG. 13 is a cross-sectional view illustrating a portion of a display device according to an embodiment.

FIG. 13 is a cross-sectional view illustrating a portion of a display device according to an embodiment. FIG. 13 may illustrate another example of the second area A2 taken along the line III-III' in FIG. 4.

The display device described with reference to FIG. 13 may be substantially the same as the display device described with reference to FIG. 5 except for structures of the gate insulation layer 1125 and the insulation interlayer 1135. Accordingly, descriptions on elements of the display device described with reference to FIG. 13, which are substantially the same as or similar to those of the display device described with reference to FIG. 5, will not be repeated in detail herein.

Referring to FIG. 13, at least one of the gate insulation layer 1125, the insulation interlayer 1135, the organic insulation layer 145, the pixel defining layer 160, and the opposite electrode 180 may have an opening overlapping the transmission area TA.

In an embodiment, the functional layer 190, the opposite electrode 180, the pixel defining layer 160, the organic insulation layer 145, the insulation interlayer 1135, and the gate insulation layer 1125 may have a first opening OP1, a second opening OP2, a third opening OP3, a fourth opening OP4, a fifth opening OP5, and a sixth opening OP6, respectively. In such an embodiment, the first opening OP1 of the functional layer 190, the second opening OP2 of the opposite electrode 180, the third opening OP3 of the pixel defining layer 160, the fourth opening OP4 of the organic insulation layer 145, the fifth opening OP5 of the insulation interlayer 1135, and the sixth opening OP6 of the gate insulation layer 1125 may form the transmitting window TW.

Figure 14:
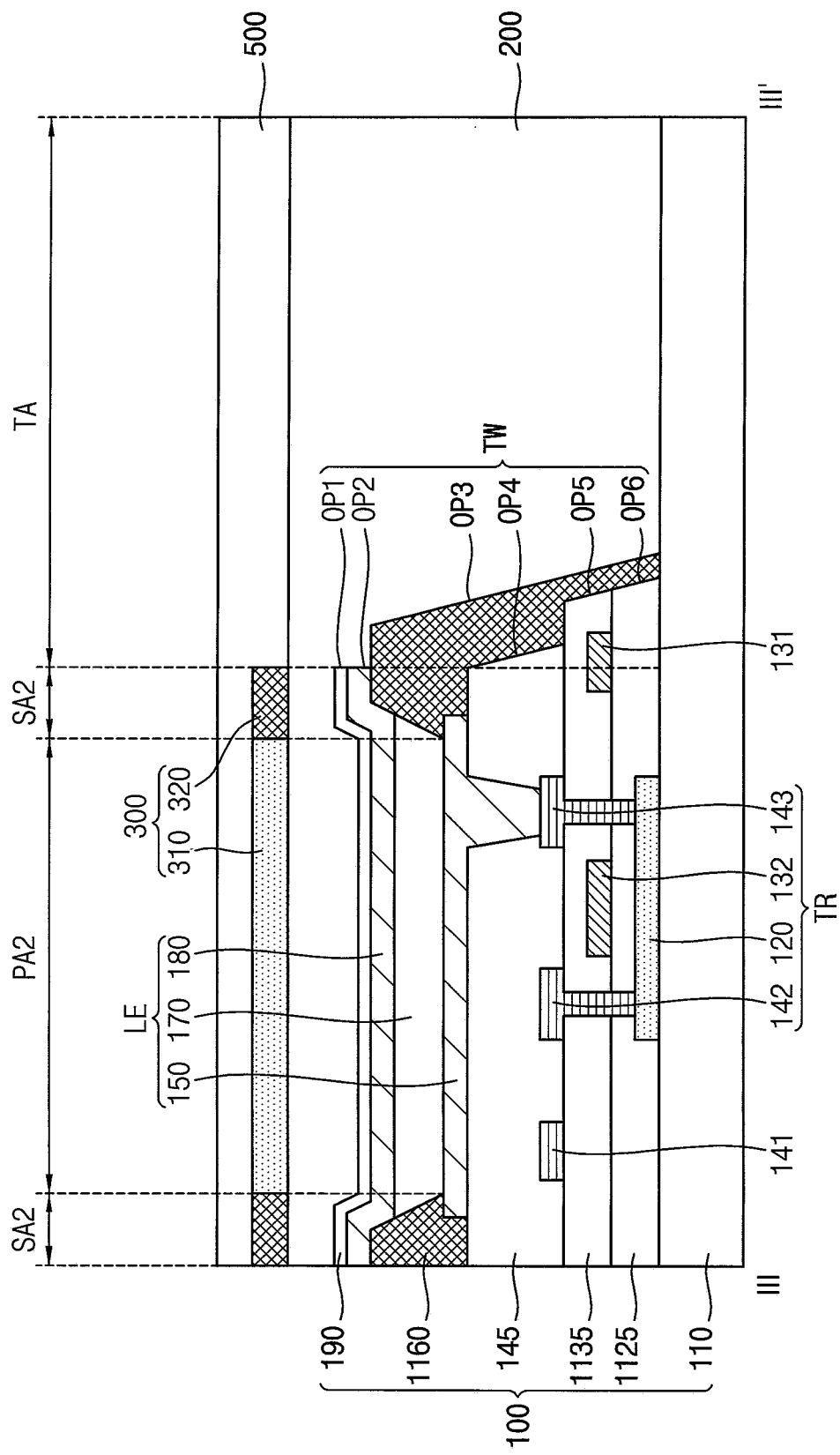
FIG. 14 is a cross-sectional view illustrating a portion of a display device according to an embodiment.

FIG. 14 is a cross-sectional view illustrating a portion of a display device according to an embodiment. FIG. 14 may illustrate another example of the second area A2 taken along the line III-III' in FIG. 4.

The display device described with reference to FIG. 14 may be substantially the same as the display device described with reference to FIG. 13 except for a structure of the pixel defining layer 1160. Accordingly, descriptions on elements of the display device described with reference to FIG. 14, which are substantially the same as or similar to those of the display device described with reference to FIG. 13, will not be repeated in detail.

The pixel defining layer 1160 may have a black color. The pixel defining layer 1160 may absorb most of external light incident onto the pixel defining layer 1160. Accordingly, the pixel defining layer 1160 may reduce or prevent the reflection of external light. The pixel defining layer 1160 may be formed of carbon black, phenylene black, aniline black, cyanine black, nigrosin acid black, black resin, or the like.

In an embodiment, the pixel defining layer 1160 may overlap a portion of each of the conductive layers 120, 131, 132, 141, 142, and 143, the inorganic insulation layers 1125 and 1135, and the organic insulation layer 145, which overlaps the transmission area TA. For example, when a portion of each of the gate line 131, the gate insulation layer 1125, the insulation interlayer 1135, and the organic insulation layer 145 overlaps the transmission area TA as illustrated in FIG. 14, the pixel defining layer 1160 may overlap the portion of each of the gate line 131, the gate insulation layer 1125, the insulation interlayer 1135, and the organic insulation layer 145, which overlaps the transmission area TA. Accordingly, external light passing through the transmission area TA may not be diffracted by the portion of the conductive layers 120, 131, 132, 141, 142, and 143, the inorganic insulation layers 1125 and 1135, and the organic insulation layer 145, which overlaps the transmission area TA, at an edge of the transmission area TA. Thus, the decrease of the transmittance of the transmission area TA may be mitigated or prevented.

Figure 15:
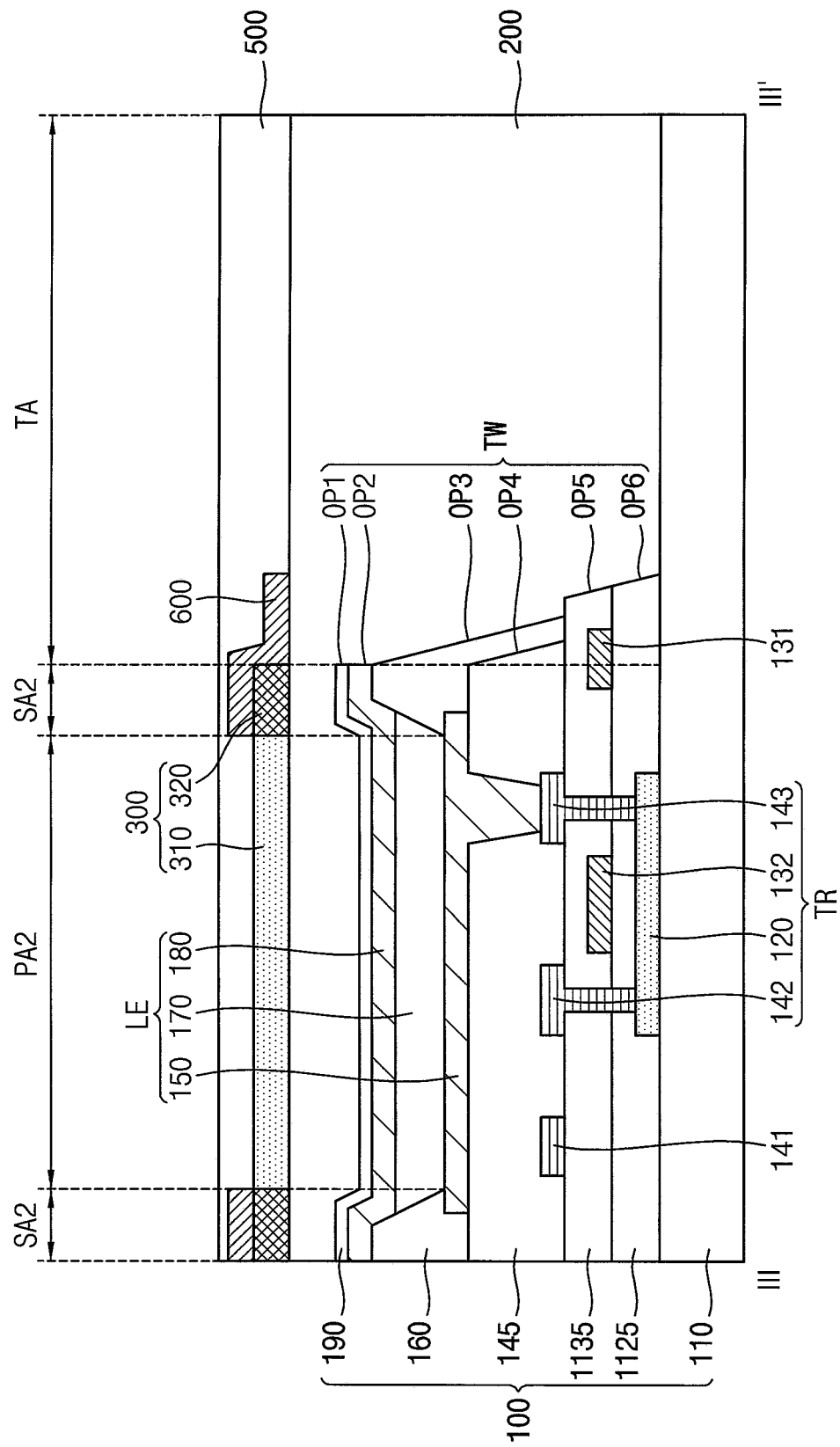
FIGS. 15 and 16 are cross-sectional views illustrating a portion of a display device according to embodiments.
Figure 16:
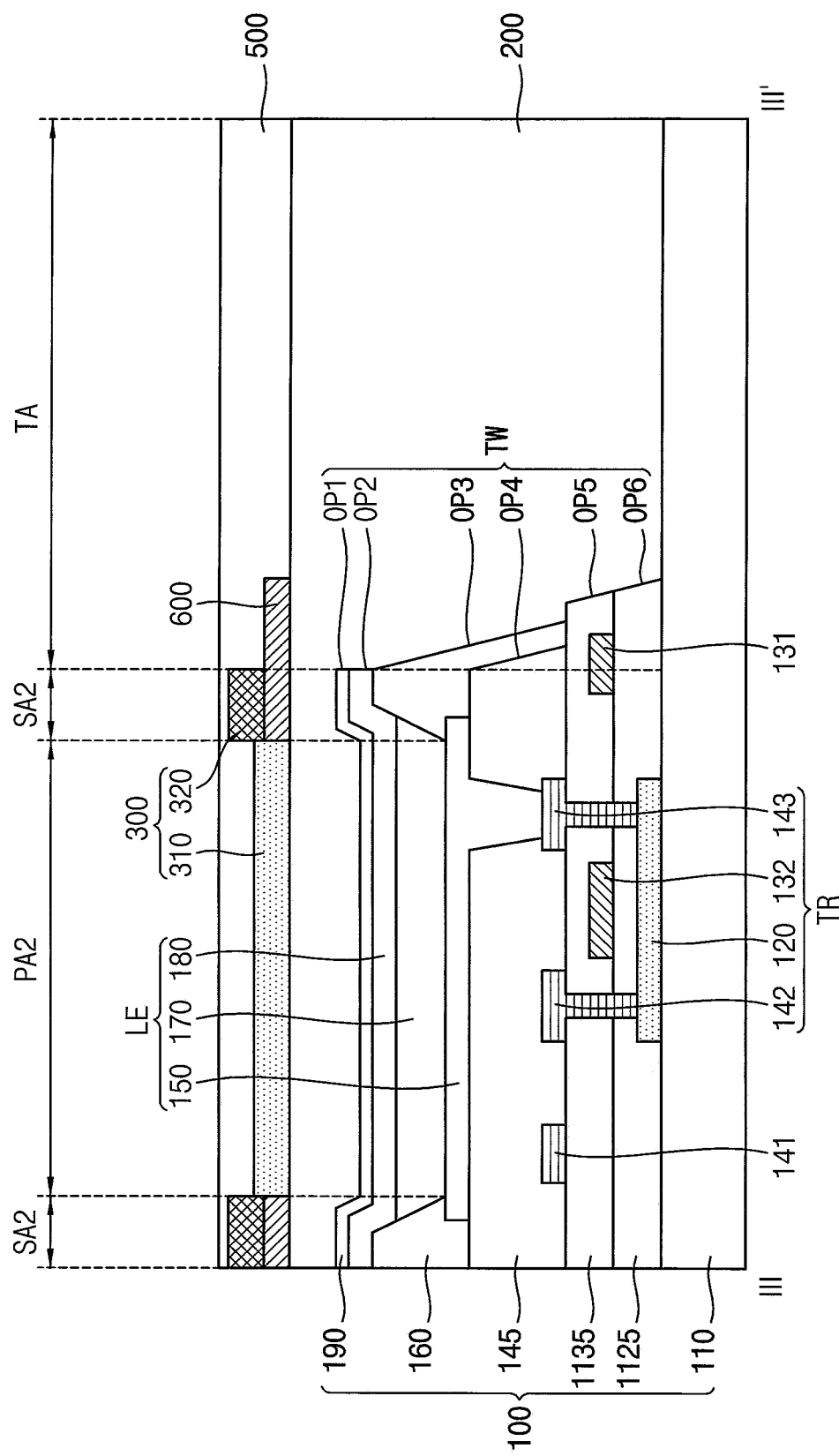

FIGS. 15 and 16 are cross-sectional views illustrating a portion of a display device according to embodiments. FIGS. 15 and 16 may illustrate other examples of the second area A2 taken along the line III-III' in FIG. 4.

The display device described with reference to FIGS. 15 and 16 may be substantially the same as the display device described with reference to FIG. 13 except for an addition of a shielding layer 600. Accordingly, descriptions on elements of the display device described with reference to FIGS. 15 and 16, which are substantially the same as or similar to those of the display device described with reference to FIG. 13, will not be repeated in detail.

Referring to FIGS. 15 and 16, the display device may include a shielding layer 600 overlapping the first surrounding area SA1 and the second surrounding area SA2. For example, the shielding layer 600 may overlap the first surrounding area SA1, the second surrounding area SA2, and an edge portion of the transmission area TA adjacent to the first surrounding area SA1 and the second surrounding area SA2.

In an embodiment, the shielding layer 600 may be disposed on the black matrix 320 as illustrated in FIG. 15. For example, the shielding layer 600 may cover the black matrix 320, and may be disposed on the encapsulation structure 200. In another embodiment, the shielding layer 600 may be disposed between the encapsulation structure 200 and the black matrix 320 as illustrated in FIG. 16.

In an embodiment, the shielding layer 600 may have a black color. In such an embodiment, the shielding layer 600 may absorb most of external light incident onto the shielding layer 600. Accordingly, the shielding layer 600 may reduce or prevent the reflection of external light. For example, the shielding layer 600 may be formed of chromium (Cr), chromium oxide ($CrO_x$), chromium nitride ($CrN_x$), carbon black, a pigment mixture, a dye mixture, or the like. In another embodiment, the shielding layer 600 may include metal.

In an embodiment, the shielding layer 600 may overlap a portion of each of the conductive layers 120, 131, 132, 141, 142, and 143, the inorganic insulation layers 1125 and 1135, the organic insulation layer 145, the pixel defining layer 160, and the opposite electrode 180, which overlaps the transmission area TA. For example, when a portion of each of the gate line 131, the gate insulation layer 1125, the insulation interlayer 1135, the organic insulation layer 145, and the pixel defining layer 160 overlaps the transmission area TA as illustrated in FIGS. 15 and 16, the shielding layer 600 may overlap the portion of each of the gate line 131, the gate insulation layer 1125, the insulation interlayer 1135, the organic insulation layer 145, and the pixel defining layer 160, which overlaps the transmission area TA. Accordingly, external light passing through the transmission area TA may not be diffracted by the portion of the conductive layers 120, 131, 132, 141, 142, and 143, the inorganic insulation layers 1125 and 1135, the organic insulation layer 145, the pixel defining layer 160, and the opposite electrode 180, which overlaps the transmission area TA, at an edge of the transmission area TA. Thus, the decrease of the transmittance of the transmission area TA may be mitigated or prevented.

Figure 17:
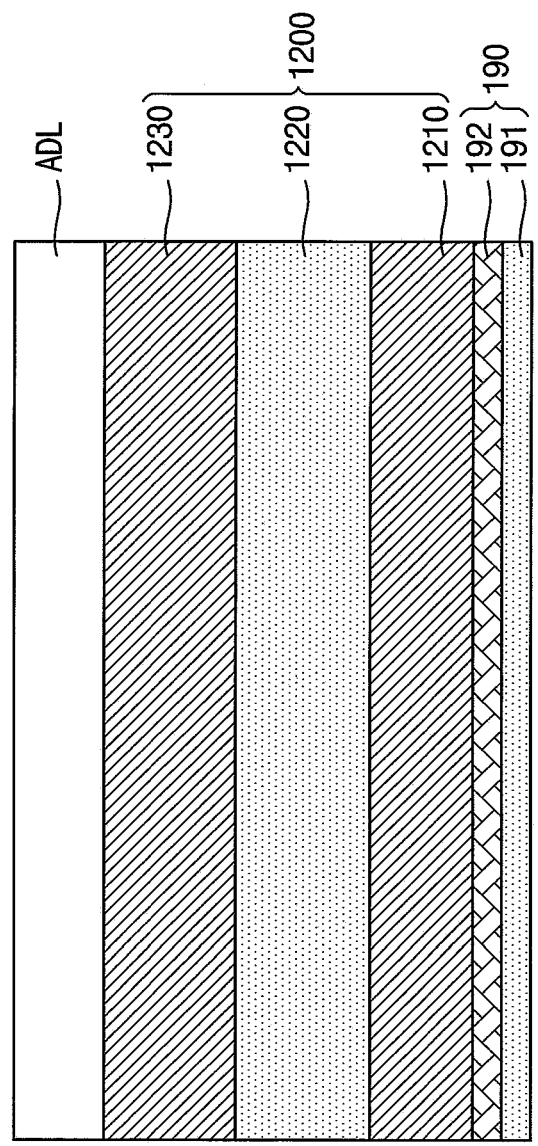
FIG. 17 is a cross-sectional view illustrating an encapsulation structure according to an embodiment.

FIG. 17 is a cross-sectional view illustrating the encapsulation structure 200 according to an embodiment. FIG. 17 may illustrate another example of the encapsulation structure 200 in FIG. 5.

Descriptions on elements of the encapsulation structure 200 described with reference to FIG. 17, which are substantially the same as or similar to those of the encapsulation structure 200 described with reference to FIG. 6, will not be repeated in detail.

Referring to FIG. 17, the encapsulation structure 200 may be disposed on the functional layer 190. The encapsulation structure 200 may include a first inorganic layer 1210, an organic layer 1220, and an second inorganic layer 1230. The organic layer 1220 may be disposed on the first inorganic layer 1210, and the second inorganic layer 1320 may be disposed on the organic layer 1220.

In an embodiment, a difference between a refractive index of the first inorganic layer 1210 and a refractive index of the organic layer 1220 and a difference between the refractive index of the organic layer 1220 and a refractive index of the second inorganic layer 1230 may be about 0.2 or less. For example, the first inorganic layer 1210 may include silicon oxynitride ($SiO_xN_y$) and have the refractive index of about 1.60, the organic layer 1220 may include organic material such as epoxy-based resin, acrylic resin, polyimide-based resin, or the like and have the refractive index of about 1.53, and the second inorganic layer 230 may include silicon oxynitride ($SiO_xN_y$) and have the refractive index of about 1.60.

A ratio of oxygen and nitrogen of silicon oxynitride ($SiO_xN_y$) included in each of the first inorganic layer 1210 and the second inorganic layer 1230 may be changed to control the refractive index of each of the first inorganic layer 1210 and the second inorganic layer 1230. For example, a refractive index may increase when a ratio (or proportion) of nitrogen in silicon oxynitride ($SiO_xN_y$) is relatively large (e.g., as the proportion of nitrogen to oxygen increases), and a refractive index may decrease when a ratio (or proportion) of oxygen in silicon oxynitride ($SiO_xN_y$) is relatively large (e.g., as the proportion of oxygen to nitrogen increases). Accordingly, when a ratio (or proportion) of oxygen in silicon oxynitride ($SiO_xN_y$) included in each of the first inorganic layer 1210 and the second inorganic layer 1230 increases, the refractive indexes of the first inorganic layer 1210 and the second inorganic layer 1230 may decrease. Therefore, the difference between the refractive index of the first inorganic layer 1210 and the refractive index of the organic layer 1220 and the difference between the refractive index of the organic layer 1220 and the refractive index of the second inorganic layer 1230 may be about 0.2 or less. Thus, reflectance of external light reflected at each of an interface between the first inorganic layer 1210 and the organic layer 1220 and an interface between the organic layer 1220 and the second inorganic layer 1230 may decrease. Therefore, transmittance of a portion of the encapsulation structure 200, which overlaps the transmission area TA, may increase, and transmittance of the second area A2 that the functional module overlaps may increase.

The display device according to the embodiments may be applied to a display device included in a computer, a notebook, a mobile phone, a smartphone, a smart pad, a PMP, a PDA, an MP3 player, or the like.

Although the display device according to the embodiments have been described with reference to the drawings, the illustrated embodiments are examples, and may be modified and changed by a person having ordinary knowledge in the relevant technical field without departing from the technical spirit described in the following claims and equivalents thereof.

What is claimed is:

1. A display device, comprising:
   a display panel having a first area and a second area, the first area comprising a first pixel area and a first surrounding area surrounding the first pixel area, and the second area comprising a second pixel area, a transmission area, and a second surrounding area surrounding the second pixel area and the transmission area;
   an encapsulation structure on the display panel and comprising at least one inorganic layer and at least one organic layer;
   a color filter on the encapsulation structure and overlapping the first pixel area and the second pixel area;
   a black matrix on the encapsulation structure and overlapping the first surrounding area and the second surrounding area; and
   a functional module on a rear surface of the display panel and overlapping the second area,
   wherein the first pixel area comprises a plurality of first sub-pixel areas,
   wherein the second pixel area comprises a plurality of second sub-pixel areas, and
   wherein a number of the second sub-pixel areas per a unit area is less than a number of the first sub-pixel areas per the unit area, and
   wherein a size of each of the second sub-pixel areas is greater than a size of each of the first sub-pixel areas.

2. The display device of claim 1, wherein the number of the second sub-pixel areas per the unit area is ½, ¼, ⅑, or ¹⁄₁₆ of the number of the first sub-pixel areas per the unit area.

3. The display device of claim 1, wherein an arrangement of the second sub-pixel areas is different from an arrangement of the first sub-pixel areas.

4. The display device of claim 1, wherein the first area surrounds at least a portion of the second area.

5. The display device of claim 1, further comprising an overcoat layer on the encapsulation structure and overlapping at least the transmission area.

6. The display device of claim 5, wherein the overcoat layer covers the color filter and the black matrix, and has a planarized upper surface.

7. The display device of claim 1, wherein the display panel comprises:
   a substrate;
   a plurality of conductive layers at a plurality of different layers from each other on the substrate;
   an organic insulation layer on the conductive layers;
   a pixel electrode on the organic insulation layer;
   a pixel defining layer on the pixel electrode and defining the first pixel area and the second pixel area;
   an emission layer on the pixel electrode; and
   an opposite electrode on the emission layer and the pixel defining layer, and
   wherein at least one of the organic insulation layer, the pixel defining layer, and the opposite electrode has an opening overlapping the transmission area.

8. The display device of claim 7, wherein the pixel defining layer has a black color.

9. The display device of claim 7, wherein the display panel further comprises a plurality of inorganic insulation layers at a plurality of different layers from each other on the substrate and insulating the conductive layers, and
   wherein at least one of the inorganic insulation layers has an opening overlapping the transmission area.

10. The display device of claim 9, wherein the pixel defining layer overlaps a portion of each of the conductive layers, the inorganic insulation layers, and the organic insulation layer that overlap the transmission area.

11. The display device of claim 1, wherein the encapsulation structure comprises:
    a first inorganic layer;
    an organic layer on the first inorganic layer; and
    a second inorganic layer on the organic layer.

12. The display device of claim 11, wherein the encapsulation structure further comprises:
    a first low refractive inorganic layer between the first inorganic layer and the organic layer and having a refractive index less than a refractive index of the first inorganic layer and greater than a refractive index of the organic layer; and
    a second low refractive inorganic layer between the organic layer and the first second inorganic layer and having a refractive index greater than the refractive index of the organic layer and less than a refractive index of the second inorganic layer.

13. The display device of claim 12, wherein each of the first low refractive inorganic layer and the second low refractive inorganic layer comprises silicon oxynitride.

14. The display device of claim 11, wherein the encapsulation structure further comprises a low refractive inorganic layer on the second inorganic layer, the low refractive inorganic layer having a refractive index less than a refractive index of the second inorganic layer.

15. The display device of claim 14, wherein the low refractive inorganic layer comprises silicon oxynitride.

16. The display device of claim 11, wherein each of a difference between a refractive index of the first inorganic layer and a refractive index of the organic layer and a difference between the refractive index of the organic layer and a refractive index of the second inorganic layer is less than 0.2.

17. The display device of claim 16, each of the first inorganic layer and the second inorganic layer comprises silicon oxynitride.

18. The display device of claim 1, wherein the functional module comprises at least one of a camera module, a face recognition sensor module, a pupil recognition sensor module, an acceleration sensor module, a proximity sensor module, an infrared sensor module, and an ambient light sensor module.

19. A display device, comprising:
a display panel having a first area and a second area, the first area comprising a first pixel area and a first surrounding area surrounding the first pixel area, and the second area comprising a second pixel area, a transmission area, and a second surrounding area surrounding the second pixel area and the transmission area;
an encapsulation structure on the display panel and comprising at least one inorganic layer and at least one organic layer;
a color filter on the encapsulation structure and overlapping the first pixel area and the second pixel area;
a black matrix on the encapsulation structure and overlapping the first surrounding area and the second surrounding area; and
a functional module on a rear surface of the display panel and overlapping the second area,
wherein the display panel comprises:
a substrate;
a plurality of conductive layers at a plurality of different layers from each other on the substrate;
an organic insulation layer on the conductive layers;
a pixel electrode on the organic insulation layer;
a pixel defining layer on the pixel electrode and defining the first pixel area and the second pixel area;
an emission layer on the pixel electrode; and
an opposite electrode on the emission layer and the pixel defining layer,
wherein at least one of the organic insulation layer, the pixel defining layer, and the opposite electrode has an opening overlapping the transmission area,
wherein the display panel further comprises a plurality of inorganic insulation layers at a plurality of different layers from each other on the substrate and insulating the conductive layers,
wherein at least one of the inorganic insulation layers has an opening overlapping the transmission area, and
wherein the display device further comprises a shielding layer overlapping at least the first surrounding area and the second surrounding area.

20. The display device of claim 19, wherein the shielding layer is on the black matrix.

21. The display device of claim 19, wherein the shielding layer is between the encapsulation structure and the black matrix.

22. The display device of claim 19, wherein the shielding layer overlaps a portion of each of the conductive layers, the inorganic insulation layers, the organic insulation layer, the pixel defining layer, and the opposite electrode that overlap the transmission area.

23. A display device, comprising:
a display panel having a first area and a second area, the first area comprising a first pixel area and a first surrounding area surrounding the first pixel area, and the second area comprising a second pixel area, a transmission area and a second surrounding area surrounding the second pixel area and the transmission area;
an encapsulation structure on the display panel and comprising at least one inorganic layer and at least one organic layer;
a color filter on the encapsulation structure and overlapping the first pixel area and the second pixel area; and
a black matrix on the encapsulation structure and overlapping the first surrounding area and the second surrounding area,
wherein the display panel comprises a transmitting window formed in at least one of a plurality of insulation layers included in the display panel and overlapping the transmission area,
wherein the first pixel area comprises a plurality of first sub-pixel areas,
wherein the second pixel area comprises a plurality of second sub-pixel areas, and
wherein a number of the second sub-pixel areas per a unit area is less than a number of the first sub-pixel areas per the unit area, and
wherein a size of each of the second sub-pixel areas is greater than a size of each of the first sub-pixel areas.

* * * * *